United States Patent
Uozaki et al.

(10) Patent No.: US 9,093,546 B2
(45) Date of Patent: Jul. 28, 2015

(54) METHOD OF MANUFACTURING SEMICONDUCTOR DEVICE AND SEMICONDUCTOR DEVICE

(71) Applicant: Renesas Electronics Corporation, Kawasaki-shi, Kanagawa (JP)

(72) Inventors: Hiroshi Uozaki, Kanagawa (JP); Yasuhiro Takeda, Kanagawa (JP); Keiichi Maekawa, Kanagawa (JP); Takumi Hasegawa, Kanagawa (JP); Kota Funayama, Kanagawa (JP); Yoshiki Maruyama, Kanagawa (JP); Kazutoshi Shiba, Kanagawa (JP); Shuichi Kudo, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 41 days.

(21) Appl. No.: 14/066,740

(22) Filed: Oct. 30, 2013

(65) Prior Publication Data
US 2014/0138758 A1    May 22, 2014

(30) Foreign Application Priority Data
Nov. 19, 2012    (JP) ................. 2012-253249

(51) Int. Cl.
| | |
|---|---|
| H01L 29/788 | (2006.01) |
| H01L 27/11 | (2006.01) |
| H01L 21/28 | (2006.01) |
| H01L 27/105 | (2006.01) |
| H01L 27/115 | (2006.01) |
| H01L 29/423 | (2006.01) |
| H01L 29/792 | (2006.01) |

(52) U.S. Cl.
CPC ........ *H01L 29/788* (2013.01); *H01L 21/28282* (2013.01); *H01L 27/105* (2013.01); *H01L 27/1104* (2013.01); *H01L 27/11573* (2013.01); *H01L 29/42344* (2013.01); *H01L 29/792* (2013.01)

(58) Field of Classification Search
CPC ................. H01L 21/28273; H01L 29/42324; H01L 27/1104; H01L 29/788
USPC .......................................... 257/317; 438/593
See application file for complete search history.

(56) References Cited

U.S. PATENT DOCUMENTS

| | | | |
|---|---|---|---|
| 6,420,754 B2 | 7/2002 | Takahashi et al. | |
| 7,557,005 B2 | 7/2009 | Ishii et al. | |
| 2004/0119107 A1* | 6/2004 | Hisamoto et al. | 257/314 |
| 2004/0232471 A1* | 11/2004 | Shukuri | 257/314 |

FOREIGN PATENT DOCUMENTS

| | | | |
|---|---|---|---|
| JP | 2000-040752 A | 2/2000 | |
| JP | 2001-244424 A | 9/2001 | |
| JP | 2007-305711 A | 11/2007 | |

* cited by examiner

*Primary Examiner* — Theresa T Doan
(74) *Attorney, Agent, or Firm* — Miles & Stockbridge P.C.

(57) ABSTRACT

An object is to provide a semiconductor device having improved reliability by preventing, in forming a nonvolatile memory and MOSFETS on the same substrate, an increase in the size of grains in a gate electrode. The object can be achieved by forming the control gate electrode of the nonvolatile memory and the gate electrodes of the other MOSFETs from films of the same layer, respectively, and configuring each of the control gate electrode and the gate electrodes from a stack of two polysilicon film layers.

7 Claims, 19 Drawing Sheets a=b a<b

US 9,093,546 B2

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2012-253249 filed on Nov. 19, 2012 including the specification, drawings and abstract is incorporated herein by reference in its entirety.

BACKGROUND

The present invention relates to a method of manufacturing a semiconductor device and a semiconductor device, in particular, to a technology effective when applied to a semiconductor device having a nonvolatile memory and a field effect transistor.

In recent years, with the scaling down of semiconductor devices, a low breakdown voltage MOSFET used in a logic circuit or the like and operated at a high speed and a flash memory which is a nonvolatile memory device has been formed on the same semiconductor substrate. As the procedure of a step of forming such a semiconductor device, there is known a method of forming a gate structure of a flash memory and then introducing an impurity into a gate electrode of a low breakdown voltage MOSFET.

Patent Document 1 (Japanese Patent Laid-Open No. 2007-305711) describes a semiconductor device obtained by forming a control gate electrode of a MONOS (metal oxide nitride oxide semiconductor) type nonvolatile memory and gate electrodes of other MOSFETS such as high breakdown voltage MOSFET so as to have a structure in which two polysilicon film layers have been stacked one after another.

Patent Document 2 (Japanese Patent Laid-Open No. 2001-244424) describes a semiconductor device obtained by forming a floating gate electrode of a nonvolatile memory, a gate electrode of a high breakdown voltage MOSFET, and a gate electrode of a low breakdown voltage MOSFET by stacking two polysilicon film layers one after another.

Patent Document 3 (Japanese Patent Laid-Open No. 2000-040752) describes a semiconductor device obtained by forming a floating gate electrode of a nonvolatile memory by stacking two polysilicon film layers one after another.

RELATED ART DOCUMENTS

Patent Documents

[Patent Document 1] Japanese Patent Laid-Open No. 2007-305711
[Patent Document 2] Japanese Patent Laid-Open No. 2001-244424
[Patent Document 3] Japanese Patent Laid-Open No. 2000-040752

SUMMARY

After formation of the gate structure of a nonvolatile memory as described above, an impurity is introduced into the gate electrode of a low breakdown voltage MOSFET. The grain of a polysilicon film configuring the gate electrode of the MOSFET has however grown due to a heating step at the time of forming the nonvolatile memory. Diffusion of the impurity to the lower portion of the gate electrode of the MOSFET is therefore disturbed and the gate electrode is depleted, resulting in the formation of a semiconductor device having deteriorated reliability.

A similar problem occurs in the gate electrode of the nonvolatile memory.

The other object and novel features will be apparent by the description herein and accompanying drawings.

The outline of typical embodiments, among those disclosed herein, will next be described briefly.

A semiconductor device according to one embodiment is manufactured by forming the control gate electrode of a nonvolatile memory and the gate electrode of the other MOSFETs from a film of the same layer and moreover, configuring the control gate electrode and the gate electrode of the other MOSFETs from a stack of at least two polysilicon film layers.

A semiconductor device according to another embodiment is manufactured by configuring the control gate electrode of a nonvolatile memory from a stack of at least two polysilicon film layers. The thickness of the polysilicon film of the lower layer is made smaller than that of the polysilicon film of the upper layer.

A semiconductor device according to a further embodiment is manufactured by configuring the gate electrode of a MOSFET from a stack of at least two polysilicon film layers. The thickness of the polysilicon film of the lower layer is made smaller than that of the polysilicon film of the upper layer.

The embodiments disclosed herein make it possible to provide a semiconductor device having improved reliability.

DETAILED DESCRIPTION

Figure 1:
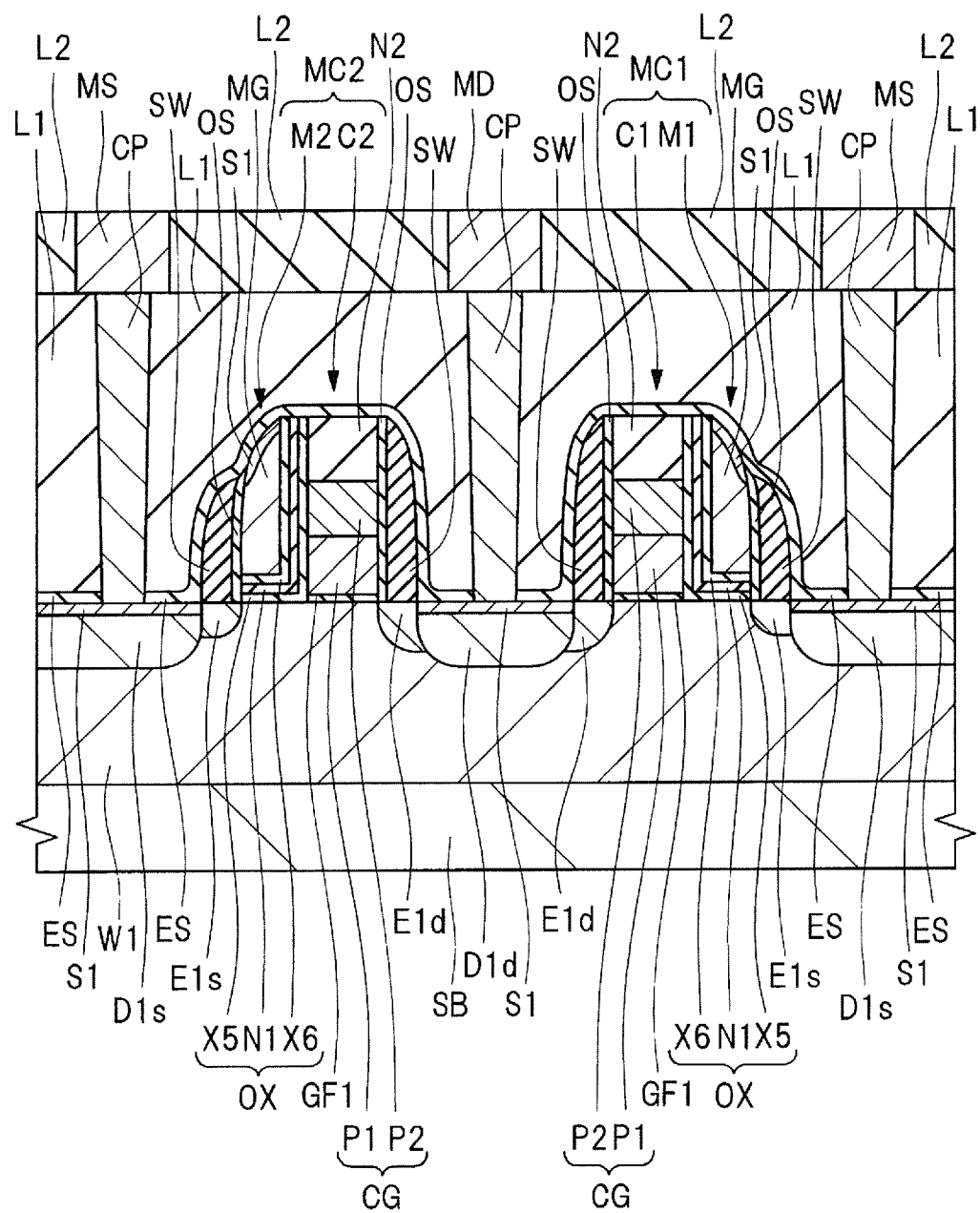
FIG. 1 is a cross-sectional view showing a semiconductor device according to First Embodiment of the present invention.

The embodiments will next be described in detail referring to drawings. In all the drawings for describing the embodiments, members having the same function will be identified by the same symbols or reference numerals and overlapping descriptions will be omitted. In the following embodiments, a description of the same or like portion will not be repeated in principle unless otherwise particularly necessary.

In the drawings used in the following embodiments, even a plan view may be partially hatched to facilitate understanding of it.

The semiconductor device according to the present embodiment has, on a semiconductor substrate, a MONOS type nonvolatile memory (which will hereinafter be called "MONOS memory", simply), a high breakdown voltage MOSFET used for input and output (I/O) of a power current or the like, and a low breakdown voltage MOSFET operated at a voltage lower than the high breakdown voltage MOSFET. The low breakdown voltage MOSFET includes, for example, a MOSFET used for a logic circuit or a MOSFET configuring a SRAM (static random access memory). What will be described below is improvement in the reliability of a semiconductor device by forming the gate electrode of each element from a stack structure of two layers and thereby suppressing the growth of grains configuring the gate electrode.

First, a MONOS memory and a SRAM configuring the semiconductor device of the present embodiment will be described.

Figure 2:
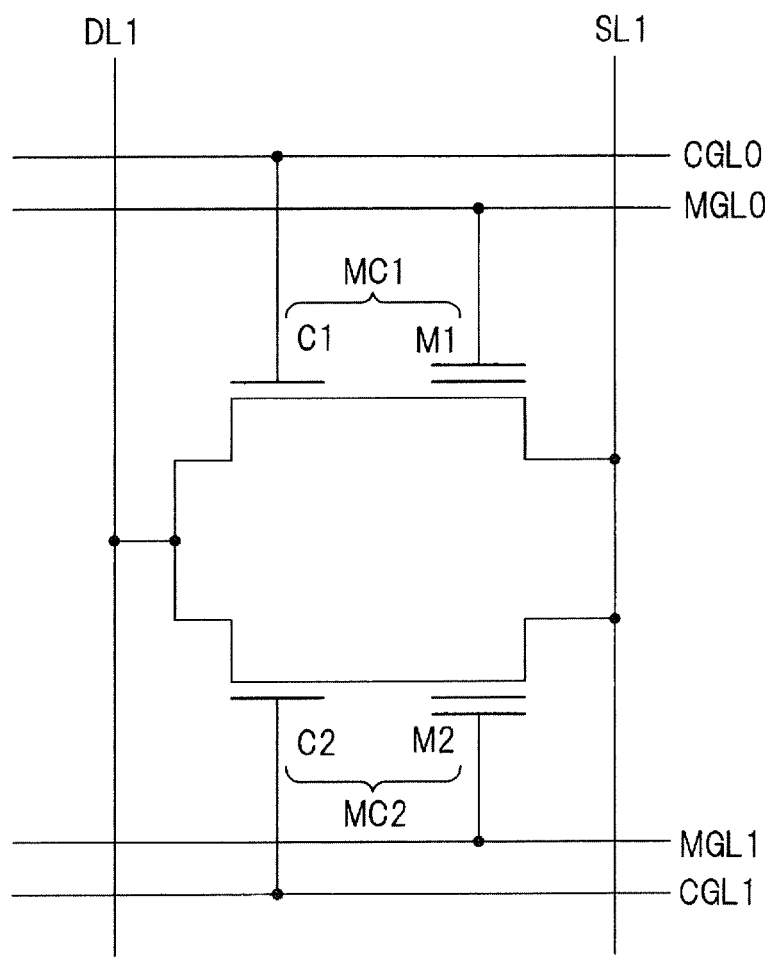
FIG. 2 is an equivalent circuit diagram showing the semiconductor device according to First Embodiment of the present invention.

FIG. 1 is a cross-sectional view showing the MONOS memory of the present embodiment and FIG. 2 is an equivalent circuit diagram of the MONOS memory shown in FIG. 1. FIGS. 1 and 2 each show two memory cells (MC1 and MC2) placed adjacent to each other.

The memory cell MC1 of the MONOS memory is formed on a p well W1 in the main surface of a semiconductor substrate SB made of a p type single crystal silicon substrate.

The memory cell MC1 is comprised of a control transistor C1 and a memory transistor M1. The gate electrode (control gate electrode CG) of the control transistor C1 is made of two layers of non-doped polysilicon films P1 and P2 stacked in a direction perpendicular to the main surface of the semiconductor substrate SB and formed on a gate insulating film GF1 made of a silicon oxide film. The polysilicon films P1 and P2 have almost the same film thickness, for example, about 44 nm.

The gate electrode (memory gate electrode MG) of the memory transistor M1 is made of an undoped polycrystalline silicon film and is formed on one of the sidewalls of the control gate electrode (selective gate electrode) CG. The control gate electrode CG has thereon a silicon nitride film N2, which is an insulating film, further, while the memory gate electrode (memory gate electrode) MG is formed in contact with the sidewall of the film stack of the gate insulating film GF1, the control gate electrode CG, and the silicon nitride film N2.

The memory gate electrode MG is electrically isolated from the control gate electrode CG and the p well W1 via an ONO (oxide nitride oxide) film OX having two portions, one being formed between the control gate electrode CG and the memory gate electrode MG and the other portion being formed between the semiconductor substrate SB and the memory gate electrode MG and therefore having an L-shaped cross-section. This means that the memory gate electrode MG is contiguous to the sidewall of the control gate electrode CG and the main surface of the semiconductor substrate SB via the ONO film OX.

The ONO film OX is made of two layers of silicon oxide films X5 and X6 and a silicon nitride film N1 formed therebetween. During data writing, hot electrons generated in a channel region are injected into the ONO film OX and captured in a trap in the silicon nitride film N1. This means that the silicon nitride film N1 is a charge storage film.

The p well W1 in the vicinity of the control gate electrode CG has therein an $n^+$ type semiconductor region $D1d$ which is a diffusion layer and functions as a drain region of the memory cell MC1. The p well W1 in the vicinity of the memory gate electrode MG has therein an $n^+$ type semiconductor region $D1s$ which is a diffusion layer and functions as a source region of the memory cell MC1.

The p well W1 in a region adjacent to the $n^+$ type semiconductor region (drain region) $D1d$ has therein an $n^-$ type semiconductor region $E1d$ having an impurity concentration lower than that of the $n^+$ type semiconductor region $D1d$. This means that the p well has therein the $n^-$ type semiconductor region $E1d$ which is a lightly doped diffusion layer and the $n^-$ type semiconductor region $D1d$ which is a heavily doped diffusion layer. The $n^-$ type semiconductor region $E1d$ is an extension region for relaxing a high electric field at the edge of the $n^+$ type semiconductor region (drain region) $D1d$ and configuring the control transistor C1 to have an LDD (lightly doped drain) structure.

The p well W1 in a region adjacent to the $n^+$ type semiconductor region (source region) $D1s$ has therein an $n^-$ type semiconductor region $E1s$ having an impurity concentration lower than that of the $n^+$ type semiconductor region $D1s$. This means that the p well has therein the $n^-$ type semiconductor region $E1s$ which is a lightly doped diffusion layer and the $n^+$ type semiconductor region $D1s$ which is a heavily doped diffusion layer. The $n^-$ type semiconductor region $E1s$ is an extension region for relaxing a high electric field at the edge of the $n^+$ type semiconductor region (source region) $D1s$ and configuring the memory transistor M1 to have an LDD structure.

The control gate electrode CG has, on one side thereof, and the memory gate electrode MG has, on the other side thereof, a sidewall SW made of a silicon oxide film. The sidewall SW is utilized for the formation of the $n^+$ type semiconductor region (drain region) $D1d$ and the $n^+$ type semiconductor region (source region) $D1s$.

The memory cell MC1 thus configured has thereabove a stopper insulating film ES made of a silicon nitride film and, via an interlayer insulating film L1 made of a silicon oxide film, a metal wiring MD which is a data line and a metal wiring MS which is a source line. The metal wiring MD is electrically coupled to the $n^+$ type semiconductor region (drain region) D1$d$ via a contact plug CP in a contact hole formed above the $n^+$ type semiconductor region (drain region) D1$d$. Similarly, the metal wiring MS is electrically coupled to the $n^+$ type semiconductor region (source region) D1$s$. The metal wirings MD and MS are each made of a metal film having a copper alloy as a principal component and the contact plug CP is made of a metal film having tungsten as a principal component.

It is to be noted that the $n^+$ type semiconductor region D1$d$, the $n^+$ type semiconductor region D1$s$, and the memory gate electrode MG have, on the upper surface thereof, a silicide layer S1 made of, for example, nickel silicide (NiSi). The material of the silicide layer S1 may be either cobalt silicide or nickel platinum silicide. The control gate electrode CG has thereon the silicon nitride film N2 so that the upper surface of the control gate electrode CG has not been silicided. As described above, the memory cell MC1 is a split gate type MONOS memory having the control gate electrode CG and the memory gate electrode MG adjacent to each other via the ONO film OX.

The memory cell MC1 has, adjacent thereto, a memory cell MC2 having a line-symmetric structure with the memory cell MC1 with the $n^+$ type semiconductor region D1$d$ therebetween. The memory cell MC2 is comprised of a control transistor C2 and a memory transistor M2, has a structure similar to that of the memory cell MC1, and has the $n^+$ type semiconductor region D1$d$ in common with the memory cell MC1.

As shown in FIG. 2, the control gate electrode CG (refer to FIG. 1) of the control transistor C1 is coupled to a control gate line CGL0, while the memory gate electrode MG (refer to FIG. 1) of the memory transistor M1 is coupled to a memory gate line MGL0. The source region (refer to FIG. 1) is coupled to a source line SL1.

The memory cell MC2 adjacent to the memory cell MC1 has the same structure as that of the memory cell MC1 and the drain region D1$d$ (refer to FIG. 1) of this memory cell is common to the drain region D1$d$ of the memory cell MC1 (refer to FIG. 1). This drain region D1$d$ is coupled to the data line DL1. Two memory cells MC1 and MC2 are placed so that they are symmetrical with the common drain region D1$d$ therebetween. The control gate electrode CG (refer to FIG. 1) of the control transistor C2 is coupled to a control gate line CGL1, while the memory gate MG (refer to FIG. 1) of the memory transistor M2 is coupled to a memory gate line MGL1. The source region D1$s$ (refer to FIG. 1) is coupled to a source line SL.

Next, each of writing, erasing and reading operations when the memory cell MC1 is allowed to serve as a selective memory cell will be described. Here, injection of electrons into the ONO film OX (refer to FIG. 1) is defined as "writing" and injection of holes into this film is defined as "erasing".

For writing, a hot electron writing system which is so-called "source side injection system" is employed. At the time of writing, for example, 0.7V, 10V, 6V, 0V, and 0V are applied to the control gate electrode CG, the memory gate electrode MG, the source region D1$s$, the drain region D1$d$, and the p well W1 (refer to FIG. 1), respectively. By this application, hot electrons are generated in a region which is in a channel region formed between the source region D1$s$ and the drain region D1$d$ and in the vicinity between the control gate electrode CG and the metal gate electrode MG and they are injected into the ONO film OX. The electrons thus injected are captured in a trap in the silicon nitride film N1 (refer to FIG. 1), which increases the threshold voltage of the memory transistor M1.

For erasing, a hot hole injection erasing system making use of a channel current is employed. At the time of erasing, for example, 0.7V, −8V, 7V, 0V, and 0V are applied to the control gate electrode CG, the memory gate electrode MG, the source region D1$s$, the drain region D1$d$, and the p well W1, respectively, by which a channel region is formed in the p well W1 below the control gate electrode CG.

Since a high voltage (7V) is applied to the source region D1$s$, a depletion layer extending from the source region D1$s$ approaches to the channel region of the control transistor C1. As a result, electrons flowing in the channel region are accelerated by a high electric field between the edge of the channel region and the source region D1$s$ and impact ionization occurs, resulting in formation of a pair of an electron and a hole. This hole is accelerated by a negative voltage (−8V) which has been applied to the memory gate electrode MG to be a hot hole and the resulting hot hole is injected into the ONO film OX. The hole thus injected is captured in a trap in the silicon nitride film N1 and decreases the threshold voltage of the memory transistor M1.

At the time of reading, for example, 1.5V, 1.5V, 0V, 1.5V, and 0V are applied to the control gate electrode CG, the memory gate electrode MG, the source region D1$s$, the drain region D1$d$, and the p well W1, respectively. This means that a writing state and an erasing state are distinguished from each other by setting a voltage to be applied to the memory gate electrode MG between the threshold voltage of the memory transistor M1 in a writing state and the threshold voltage of the memory transistor M1 in an erasing state.

The SRAM according to the present embodiment will next be described.

Figure 3:
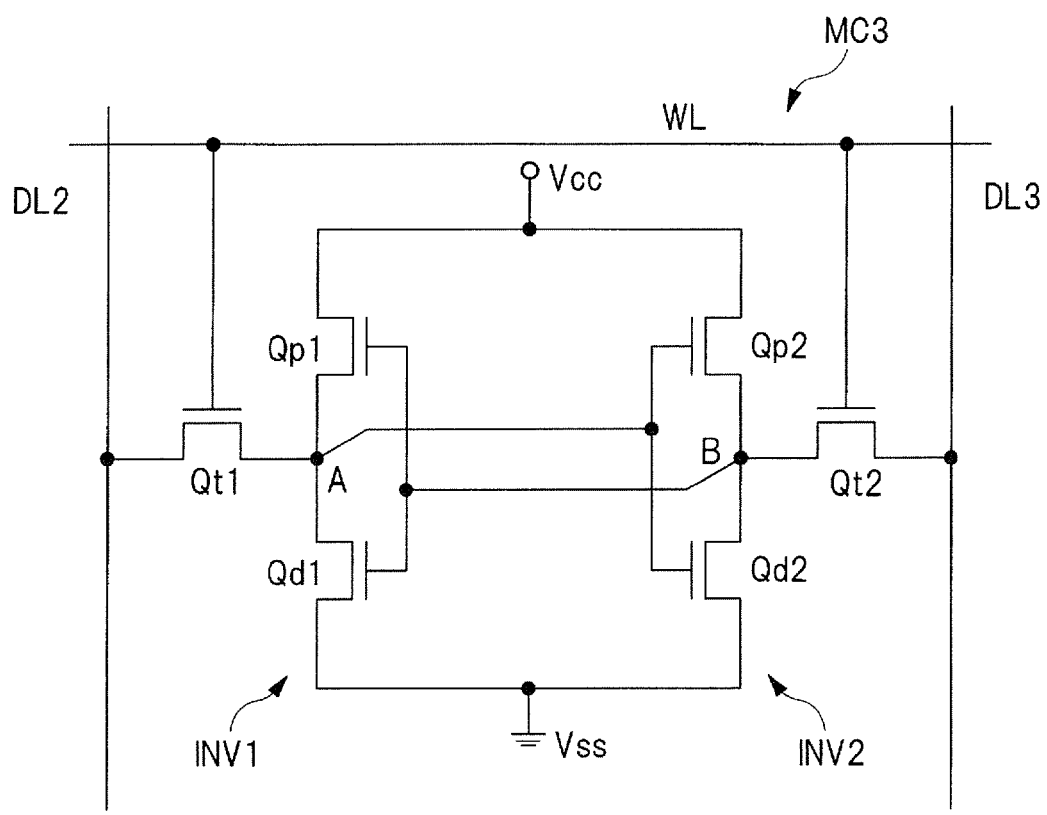
FIG. 3 is an equivalent circuit diagram showing the semiconductor device according to First Embodiment of the present invention.

First, an equivalent circuit of a memory cell MC3 configuring the SRAM will be described. FIG. 3 is an equivalent circuit diagram showing the memory cell MC3 of the SRAM in First Embodiment. As shown in FIG. 3, this memory cell MC3 is placed at the intersection between a pair of complementary data lines (data line DL2 and data line DL3) and a word line WL and is comprised of a pair of driver MOSFETs Qd1 and Qd2, a pair of load MOSFETs Qp1 and Qp2, and a pair of transfer MOSFETs Qt1 and Qt2. The driver MOSFETs Qd1 and Qd2 and the transfer MOSFETs Qt1 and Qt2 are comprised of an n channel type MOSFET, while the load MOSFETs Qp1 and Qp2 are comprised of a p channel type MOSFET.

Among the six MOSFETs configuring the memory cell MC3, the driver MOSFET Qd1 and the load MOSFET Qp1 configure a CMOS (complementary metal oxide semiconductor) inverter INV1, while the driver MOSFET Qd2 and the load MOSFET Qp2 configure a CMOS inverter INV2. The input/output terminals (storage nodes A and B) of the CMOS inverters INV1 and INV2 configuring a pair are crosslinked to each other and configure a flip flop circuit as a data storage part which stores one bit of information. One of the input/output terminals (storage node A) of this flip flop circuit is coupled to one of the source region and the drain region of the transfer MOSFET Qt1 and the other input/output terminal (storage node B) is coupled to one of the source region and the drain region of the transfer MOSFET Qt2.

Further, the other one of the source region and the drain region of the transfer MOSFET Qt1 is coupled to the data line DL2 and the other one of the source region and the drain region of the transfer MOSFET Qt2 is coupled to the data line DL3. One end (the source region of each of the load MOS- FETs Qp1 and Qp2) of the flip flop circuit is coupled to a power voltage (Vcc) and the other end (the source region of each of the driver MOSFETs Qd1 and Qd2) is coupled to a reference voltage (Vss).

The operation of the above-mentioned circuit will next be described. When the potential of the storage node A of the CMOS inverter INV1 is high (H), the driver MOSFET Qd2 is turned ON so that the potential of the storage node B of the other CMOS inverter INV2 becomes low (L). The driver MOSFET Qd1 is therefore turned OFF and the potential of the storage node A is kept high (H). This means that the respective states of the storage nodes A and B are maintained by a latch circuit in which a pair of CMOS inverters INV1 and INV2 are cross-linked to each other and data is stored during application of a power voltage.

The word line WL is coupled to the gate electrode of each of the transfer MOSFETs Qt1 and Qt2 and this word line WL controls conduction or non-conduction of the transfer MOSFETs Qt1 and Qt2. Described specifically, when the potential of the word line WL is high (H), the transfer MOSFETs Qt1 and Qt2 are turned ON and the latch circuit and the complementary data line (data lines DL2 and DL3) are electrically coupled to each other. As a result, the potential level (H or L) of the storage nodes A and B appears in the data lines DL2 and DL3, which are read out as the data of the memory cell MC3.

In order to write data into the memory cell MC3, the word line WL is set at a (H) potential level and the transfer MOSFETs Qt1 and Qt2 are turned ON to transmit the data of the data lines DL2 and DL3 to the storage nodes A and B. Thus, the SRAM can be operated.

Figure 4:
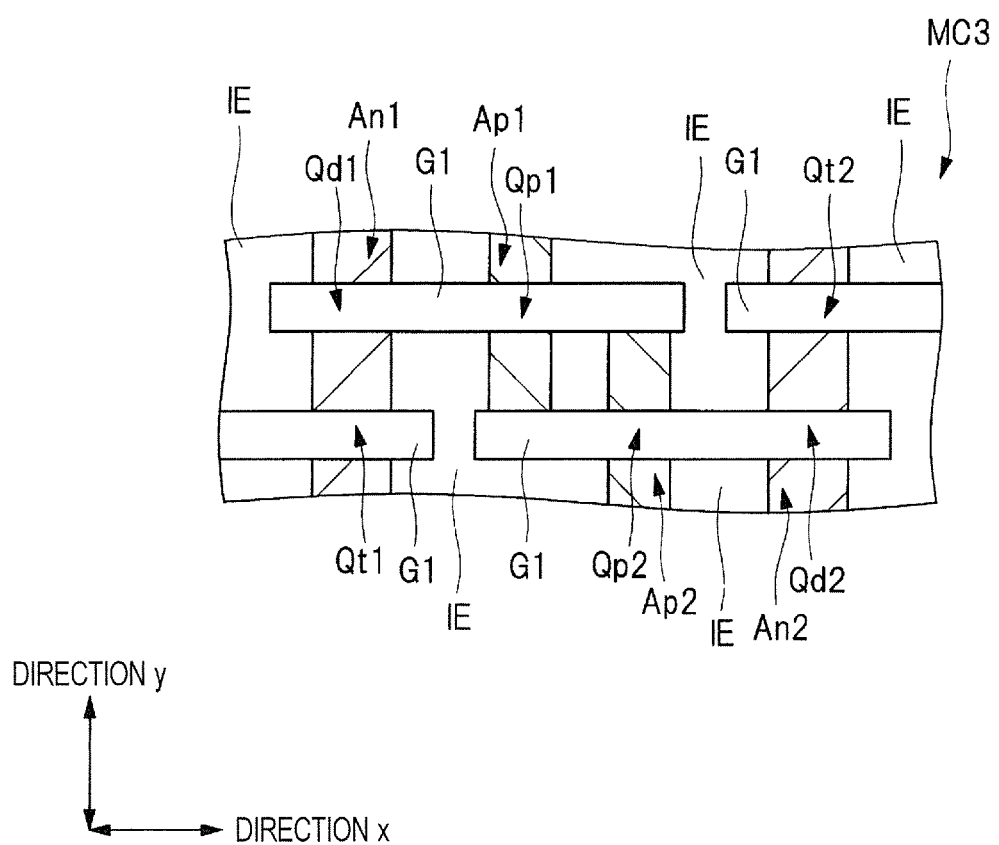
FIG. 4 is a planar layout showing the semiconductor device according to First Embodiment of the present invention.

The layout configuration of the SRAM according to the present embodiment will next be described. For example, as shown in FIG. 4, the memory cell MC3 of the SRAM is comprised of six field effect transistors formed on a semiconductor substrate, that is, a pair of driver MOSFETs Qd1 and Qd2, a pair of load MOSFETs Qp1 and Qp2, and a pair of transfer MOSFETs Qt1 and Qt2. The pair of driver MOSFETs Qd1 and Qd2 and the pair of transfer MOSFETs Qt1 and Qt2 are comprised of an n channel type MOSFET, while the pair of load MOSFETs Qp1 and Qp2 is comprised of a p channel type MOSFET. FIG. 4 is a planar layout showing the memory cell MC3 which is a portion of the SRAM configuring the semiconductor device of the present embodiment.

Described specifically, the semiconductor substrate is partitioned into a plurality of active regions with an element isolation region 1E. The active regions An1, An2, Ap1, and Ap2 partitioned with the element isolation region 1E are aligned in a direction x (second direction) which is a direction along the main surface of the semiconductor substrate and are arranged so as to extend in a direction y (first direction) which is a direction perpendicular to the direction x. These active regions An1, An2, Ap1, and Ap2 are surrounded by the element isolation region 1E.

In the active regions An1 and An2 forming an n channel type MOSFET, a source region and a drain region are formed by introducing an n type impurity such as P (phosphorus) or As (arsenic) into the active regions An1 and An2. The active regions An1 and An2 between the source region and the drain region have, on the active regions, a gate electrode G1 via a gate insulating film.

The gate electrode G1 extends in the direction x (second direction) intersecting with the direction y (first direction) along which the active regions An1 and An2 extend. Thus, an n channel type MOSFET is formed from the gate electrode G1 formed on the active regions An1 and An2 and the source region and the drain region formed in the active regions An1 and An2 so as to sandwich the gate electrode G1 between the source region and the drain region. Similarly, a p channel type MOSFET is formed from the gate electrode G1 formed on the active regions Ap1 and Ap2 and the source region and the drain region formed in the active regions An1 and An2 so as to sandwich the gate electrode G1 between the source region and the drain region.

For example, in the memory cell MC3 of the SRAM, the driver MOSFET Qd1 and the transfer MOSFET Qt1 are formed in the same active region An1 from the source region, the drain region, and two gate electrodes G1 formed in the active region An1. The load MOSFET Qp1 is formed from the source region, the drain region, and the gate electrode G1 formed in the active region Ap1; and the load MOSFET Qp2 is formed from the source region, the drain region, and the gate electrode G1 formed in the active region Ap2. Similarly, the driver MOSFET Qd2 and the transfer MOSFET Qt2 are formed in the same active region An2 from the source region, the drain region, and the gate electrode G1 formed in the active region An2.

In the load MOSFETs Qp1 and Qp2 which are p channel type MOSFETs, a p type impurity such as B (boron) has been introduced into the gate electrode G1, while in the transfer MOSFETs Qt1 and Qt2 and the driver MOSFETs Qd1 and Qd2 which are n channel type MOSFETs, an n type impurity such as P (phosphorus) or As (arsenic) has been introduced into the gate electrode G1. This means that a p type impurity such as B (boron) has been introduced into the gate electrode G1 on the active regions Ap1 and Ap2 and an n type impurity such as P (phosphorus) or As (arsenic) has been introduced into the gate electrode G1 on the active regions An1 and An2.

A method of manufacturing the semiconductor device of the present embodiment having the above-mentioned MONOS memory and SRAM will next be described referring to FIGS. 5 to 17. FIGS. 5 to 17 are cross-sectional views showing the manufacturing steps of the semiconductor device according to the present embodiment. FIG. 11 describes the step, which is described referring to FIG. 10, by using a cross-section different from that of FIG. 10.

FIGS. 5 to 10 and FIGS. 12 to 17 each show the cross-sections of four regions. They are, from the left, a MONOS memory formation region 1A, a high breakdown voltage MOSFET formation region 1B, a low breakdown voltage MOSFET formation region 1C, and a SRAM MOSFET formation region 1D. The MOSFET formed in the SRAM MOSFET formation region 1D is an n channel type MOSFET and the gate electrode configuring this MOSFET also configures the gate electrode of a p channel type MOSFET in an unillustrated region. This means that the gate electrode of the MOSFET formed in the SRAM MOSFET formation region 1D configures, in a portion thereof (for example, a portion immediately above the active region An1 shown in FIG. 4), the gate electrode of an n channel type MOSFET and, in the other portion (for example, a portion immediately above the active region Ap1 shown in FIG. 4), configures the gate electrode of a p channel type MOSFET.

Both the n channel type and p channel type MOSFETs are formed on the semiconductor substrate, but to facilitate understanding of the description on the manufacturing steps of the semiconductor device, the manufacturing steps will be described with an n channel type MOSFET as an example. In addition, FIG. 1 shows memory cells MC1 and MC2 adjacent to each other, but in the cross-sectional views for describing the following manufacturing steps, only a region in which one of the memory cells of two MONOS memories facing to each other will be formed is shown to simplify the drawings.

Figure 5:
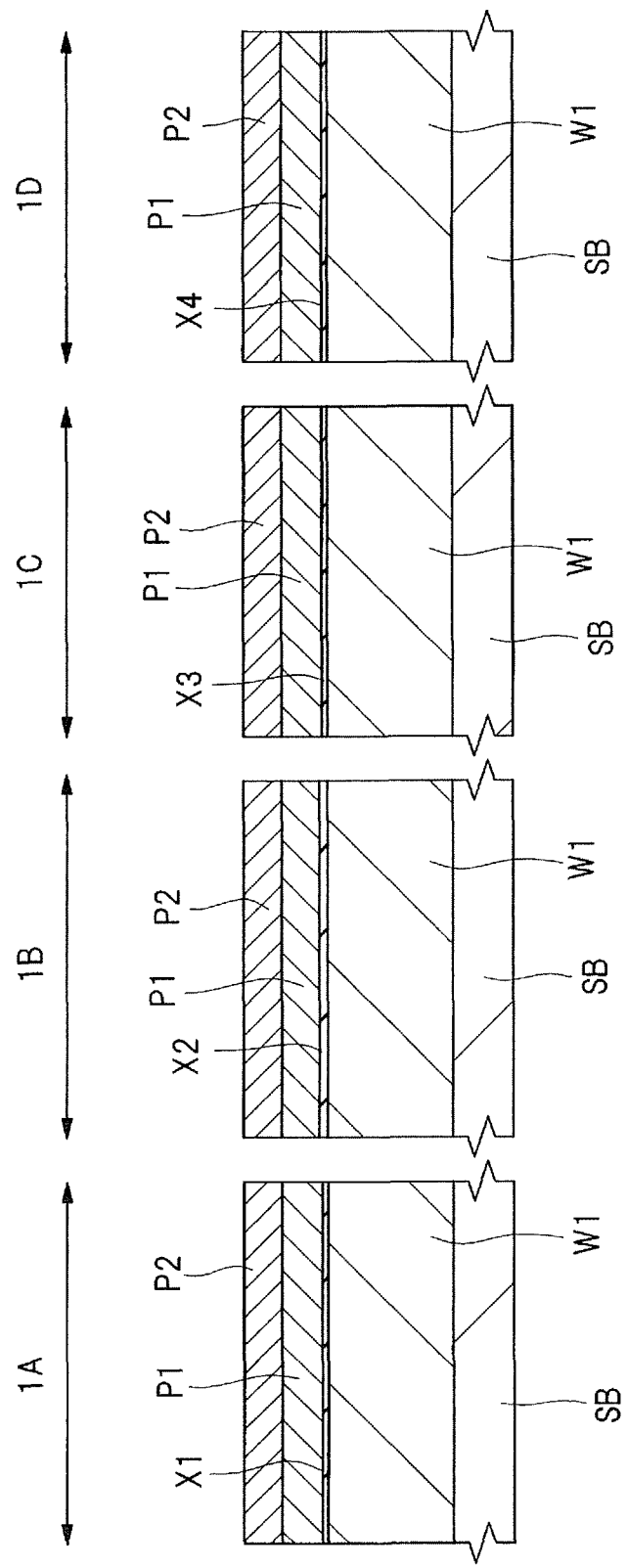
FIG. 5 is a cross-sectional view showing a method of manufacturing the semiconductor device according to First Embodiment of the present invention.

First, as shown in FIG. 5, after a semiconductor substrate SB made of single crystal silicon is provided, a plurality of trenches is formed in the main surface of the semiconductor substrate SB in a known manner. Inside of each of the trenches, an element isolation region (not illustrated) made of, for example, a silicon oxide film is formed. The element isolation region is, for example, an insulating film having an STI (shallow trench isolation) structure. Then, a p type impurity (for example, B (boron)) is injected into the main surface of the semiconductor substrate SB by using, for example, ion implantation to form a p well W1. The semiconductor substrate SB is then heated at 1000° C. for 10 seconds to diffuse the impurity thus injected by ion implantation.

Next, silicon oxide films X1, X2, X3, and X4 are formed on the main surfaces of the semiconductor substrate SB in the MONOS memory formation region 1A, the high breakdown voltage MOSFET formation region 1B, the low breakdown voltage MOSFET formation region 1C, and the SRAM MOSFET formation region 1D, respectively. The silicon oxide film X2 is formed with a thickness greater than that of the silicon oxide films X1, X3, and X4. Then, undoped polysilicon films P1 and P2 are formed (deposited) successively on the main surface of the semiconductor substrate SB, for example, by CVD (chemical vapor deposition), by which these two layers of the polysilicon films P1 and P2 are stacked on the main surface of the semiconductor substrate SB successively in a direction perpendicular to the main surface of the semiconductor substrate SB. This means that the polysilicon film P2 is formed on the polysilicon film P1. The polysilicon films P1 and P2 each have a film thickness of about 44 nm.

At this time, there is a possibility of a thin silicon oxide film (not illustrated) being formed between the polysilicon films P1 and P2, but this silicon oxide film is not always necessary. Even if they have therebetween no silicon oxide film, the polysilicon films P1 and P2 have originally no continuous crystallinity and are formed as separate layers so that they are not integrated with each other. This means that there is a boundary between the polysilicon films P1 and P2 and crystallinity of silicon is interrupted at this boundary. This will equally apply to them after completion of the MONOS memory and the other MOSFETs in later steps.

Here, the polysilicon films P1 and P2 are formed not by stacking two layers of amorphous silicon films and then crystallizing these two layers by heat treatment but by forming, from the beginning, the polysilicon films P1 and P2 as films with crystallinity.

When silicon oxide films different in thickness are formed as described above, a thick silicon oxide film is formed first on the entire main surface of the semiconductor substrate SB by using, for example, CVD. Then, photolithography is used to remove the silicon oxide film from the MONOS memory formation region 1A, the low breakdown voltage MOSFET formation region 1C, and the SRAM MOSFET formation region 1D. Next, a silicon oxide film with a thickness smaller than that of the above-mentioned silicon oxide film is formed using thermal oxidation or the like on the main surface of the exposed semiconductor substrate SB. Then, polysilicon films P1 and P2 are formed on the semiconductor substrate SB. Then, an n type impurity (for example, As (arsenic) or P (phosphorus)) is ion implanted into the polysilicon films P1 and P2 in the MONOS memory formation region 1A.

Figure 6:
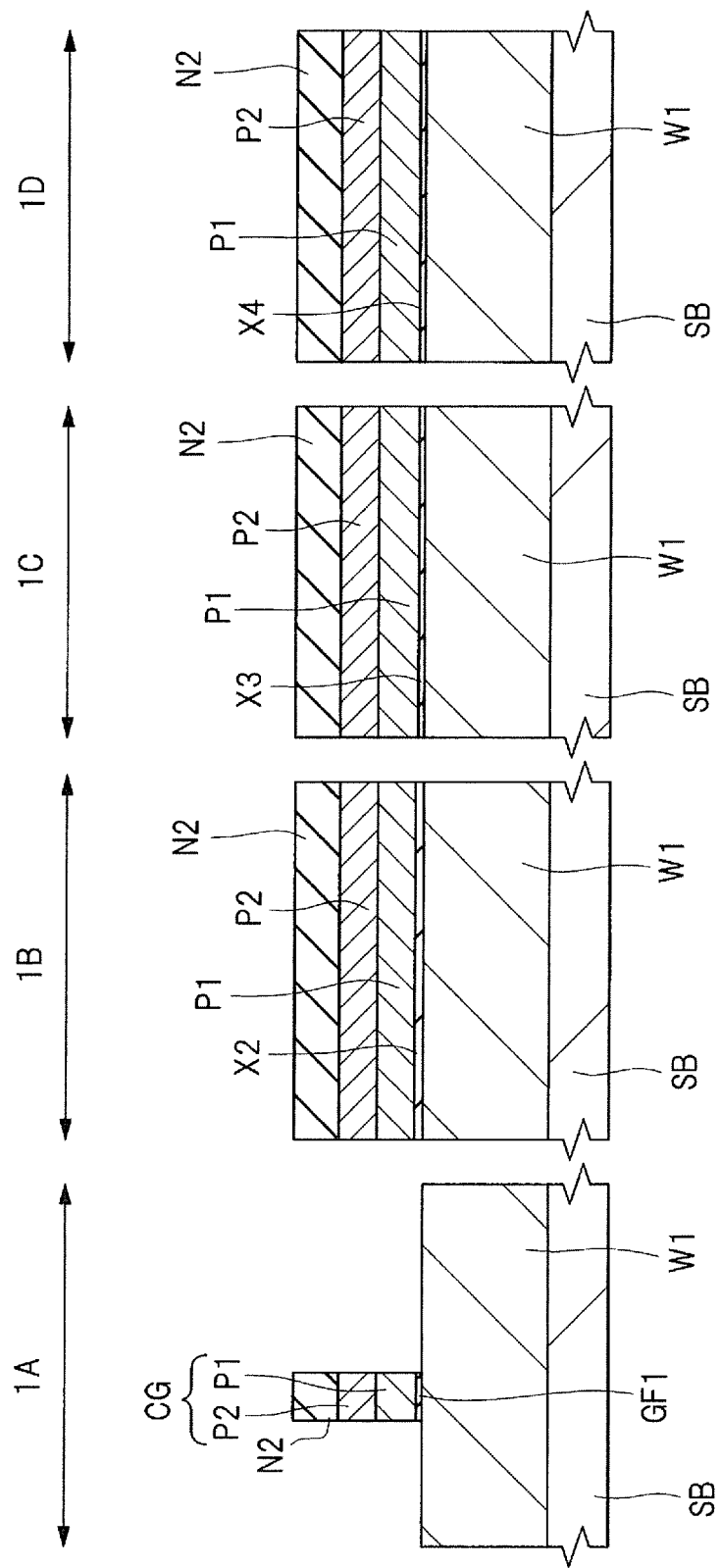
FIG. 6 is a cross-sectional view showing the method of manufacturing the semiconductor device following that of FIG. 5.

Next, as shown in FIG. 6, a silicon nitride film N2 is formed on the polysilicon film P2 by using CVD or the like. It is to be noted that a silicon oxide film (not illustrated) may be formed between the polysilicon film P2 and the silicon nitride film N2. Then, the main surface of the semiconductor substrate SB in the high breakdown voltage MOSFET formation region 1B, the low breakdown voltage MOSFET formation region 1C, and the SRAM MOSFET formation region 1D is covered with a photoresist film (not illustrated). Then, dry etching is used to remove the silicon nitride film N2, the polysilicon films P2 and P1, and the silicon oxide film X1 from a portion of the MONOS memory formation region 1A exposed from the photoresist film.

As a result, in the MONOS memory formation region 1A, a gate insulating film GF1 made of the silicon oxide film X1 is formed immediately below a region covered with the photoresist film and a control gate electrode CG made of a film stack pattern of the polysilicon films P1 and P2 is formed immediately above the gate insulating film GF1.

The control gate electrode CG in the MONOS memory formation region 1A is made of a film stack because of the following reason peculiar to the MONOS memory. The polysilicon film P1 of the present embodiment is thin so that processing of the memory gate electrode MG, which will be formed in a later step, into sidewall form inevitably reduces the height of the memory gate electrode MG and also remarkably reduces its length in a gate length direction. In the worst case, the memory gate electrode MG is scarcely formed. Accordingly, the above-mentioned inconvenience is overcome by employing the stack structure of polysilicon films P1 and P2 for the control gate electrode CG.

Figure 7:
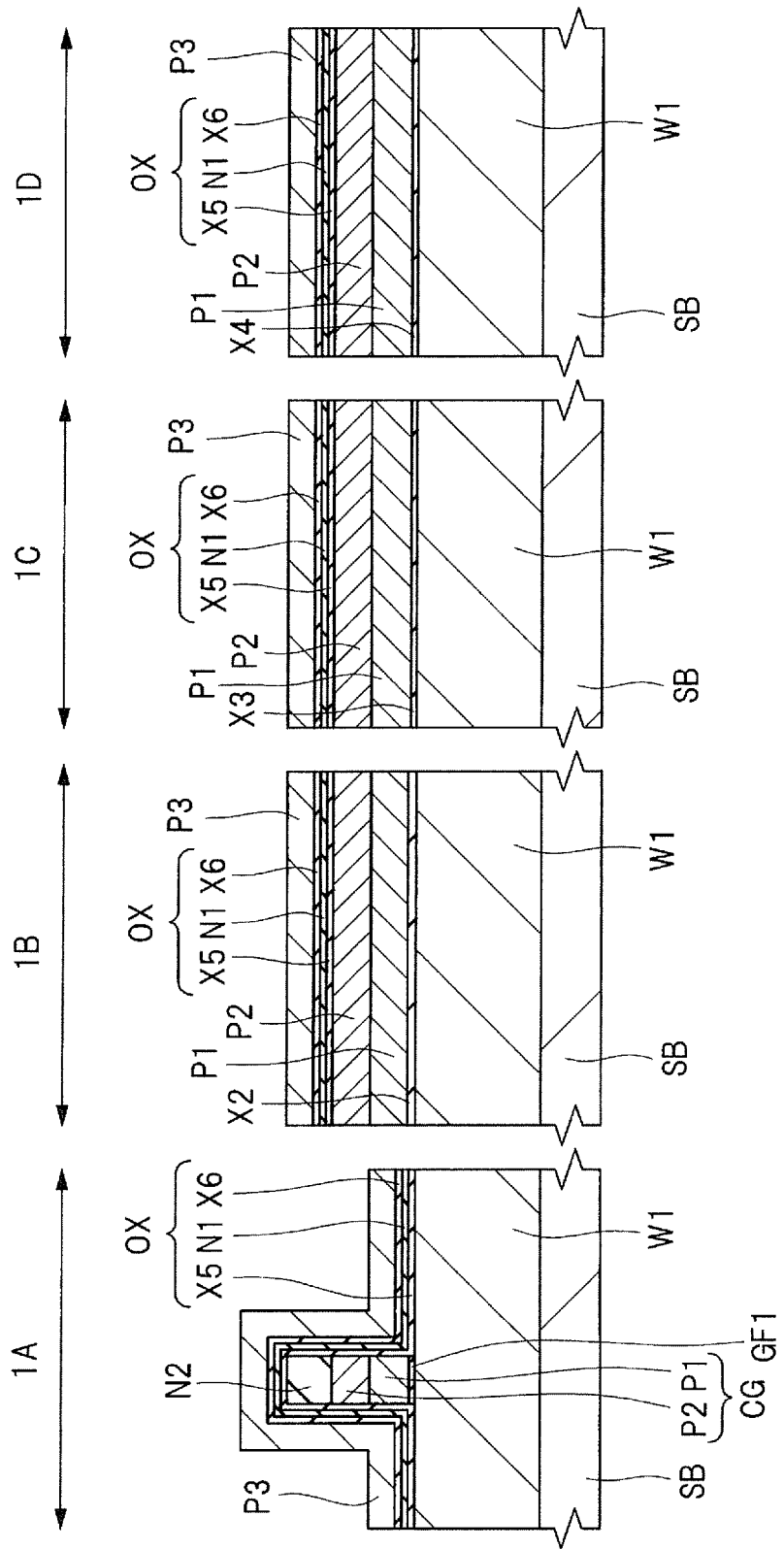
FIG. 7 is a cross-sectional view showing the method of manufacturing the semiconductor device following that of FIG. 6.

Next, as shown in FIG. 7, the silicon nitride film N2 is removed from the high breakdown voltage MOSFET formation region 1B, the low breakdown voltage MOSFET formation region 1C, and the SRAM MOSFET formation region 1D by using photolithography and etching to leave the silicon nitride film N2 on the control gate electrode CG of the MONOS memory formation region 1A.

Then, without covering the semiconductor substrate SB with a photoresist film, a silicon oxide film X5, a silicon nitride film N1, a silicon oxide film X6, and a polysilicon film P3 are formed (deposited) successively on the main surface of the semiconductor substrate SB by using ISSG (in-situ steam generation) oxidation or CVD. When the silicon nitride film N1 is formed, nitriding treatment is conducted. During the ISSG oxidation or nitriding treatment step, the semiconductor substrate SB is heated at a temperature as high as 1000° C. or greater for tens of seconds. Setting the heating temperature for nitriding treatment lower than the above-mentioned temperature deteriorates the performance of the nonvolatile memory including the silicon nitride film N1 so that setting the heating temperature lower the above-mentioned temperature makes it difficult to maintain the performance of the semiconductor device.

With the formation of the above-mentioned silicon oxide film X5, the silicon nitride film N1, and the silicon oxide film X6, an impurity of the control gate electrode CG diffuses. The control gate electrode CG is made of two layers so that an increase in threshold voltage of the nonvolatile memory can be prevented. This phenomenon will be described in detail later.

The polysilicon films P1 and P2, the silicon oxide film X5, the silicon nitride film N1, the silicon oxide film X6, and the polysilicon film P3 are formed successively on the silicon oxide films X2, X3, and X4 formed respectively in the high breakdown voltage MOSFET formation region 1B, the low breakdown voltage MOSFET formation region 1C, and the SRAM MOSFET formation region 1D. In the MONOS memory formation region 1A, a film stack of the silicon oxide film X5, the silicon nitride film N1, the silicon oxide film X6, and the polysilicon film P3 is formed so as to cover the sidewall and upper surface of a film stack pattern made of the gate insulating film GF1, control gate electrode CG, and the silicon nitride film N2 and also the main surface of the semiconductor substrate SB.

In an unillustrated region, the film stack pattern of the MONOS memory formation region 1A has, on the side thereof, a similar film stack pattern which makes a pair. These two film stack patterns are separated from each other to some extent so that the sidewalls of the polysilicon film P1 formed on the opposite surfaces of these two film stack patterns are not in contact with each other. The silicon oxide films X5 and X6 and the silicon nitride film N1 configure an ONO film OX.

Figure 8:
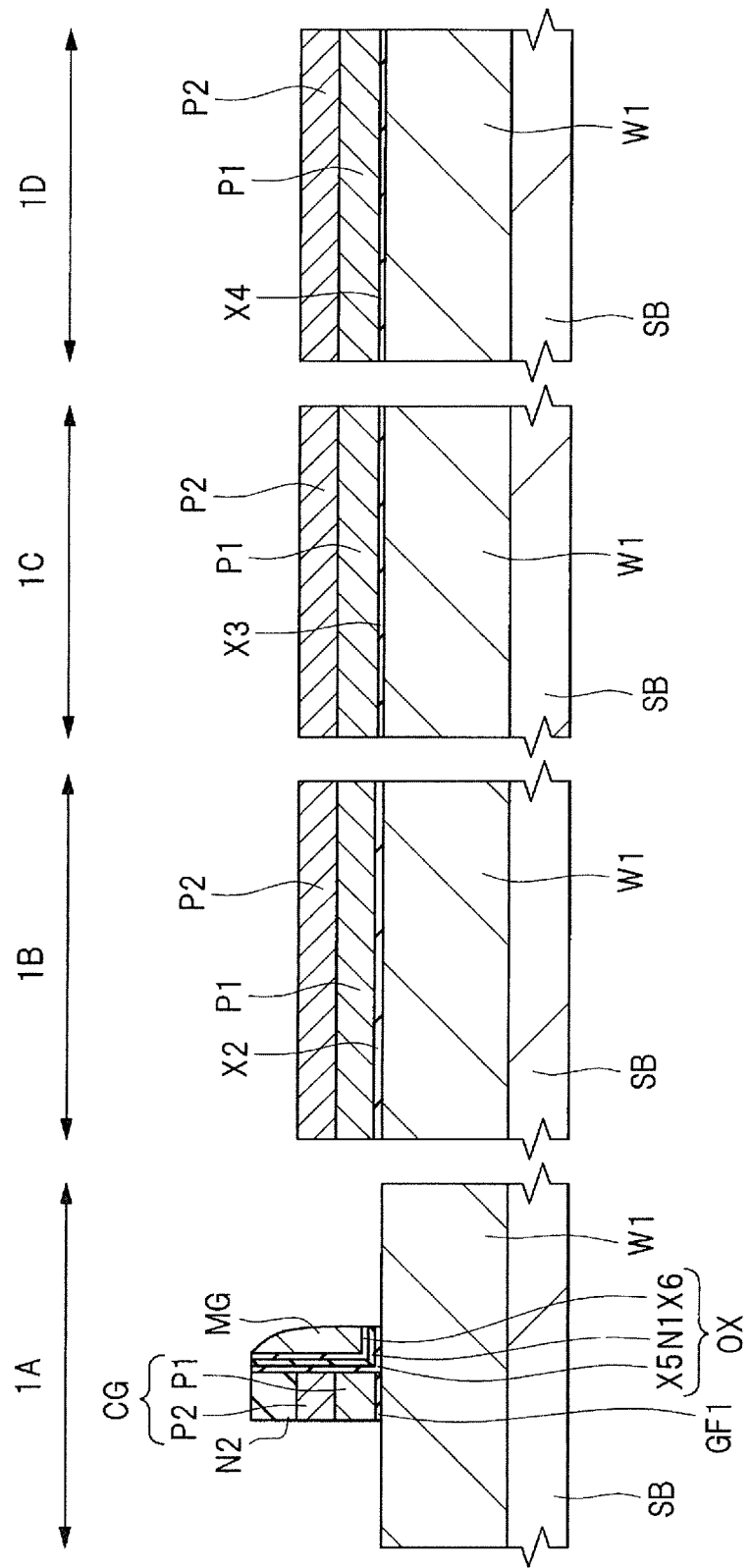
FIG. 8 is a cross-sectional view showing the method of manufacturing the semiconductor device following that of FIG. 7.

Next, as shown in FIG. 8, the upper surface of the ONO film OX is exposed by partially removing the polysilicon film P3, for example, by dry etching. As a result, the polysilicon film P3 remains in the form of sidewall on the sidewalls on both sides of the film stack pattern including the control gate electrode CG in the MONOS memory formation region 1A.

Then, a photoresist film (not illustrated) is formed which covers the high breakdown voltage MOSFET formation region 1B, the low breakdown voltage MOSFET formation region 1C, and the SRAM MOSFET formation region 1D and also covers the polysilicon film P3 formed on one of the sidewalls of the film stack pattern. By etching with this photoresist film as a mask, the polysilicon film P3 formed on the other sidewall of the film stack pattern is removed. As a result, on one of the sidewalls of the control gate electrode CG, a memory gate electrode MG made of the polysilicon film P3 is formed via the ONO film OX.

After removal of the photoresist film, the ONO film OX is removed using wet etching to expose the polysilicon film P2 in the high breakdown voltage MOSFET formation region 1B, the low breakdown voltage MOSFET formation region 1C, and the SRAM MOSFET formation region 1D. By using this wet etching, the main surface of the semiconductor substrate SB and the surface of the silicon nitride film N1 in the MONOS memory formation region 1A are exposed. As a result, one of the sidewalls of the control gate electrode CG not covered with the memory gate electrode MG is exposed.

The ONO film OX remains only between one of the sidewalls of the film stack pattern and the memory gate electrode MG and between the memory gate electrode MG and the main surface of the semiconductor substrate SB. The ONO film OX therefore has an L-shaped cross-section and electrically isolates the control gate electrode CG from the memory gate electrode MG.

Figure 9:
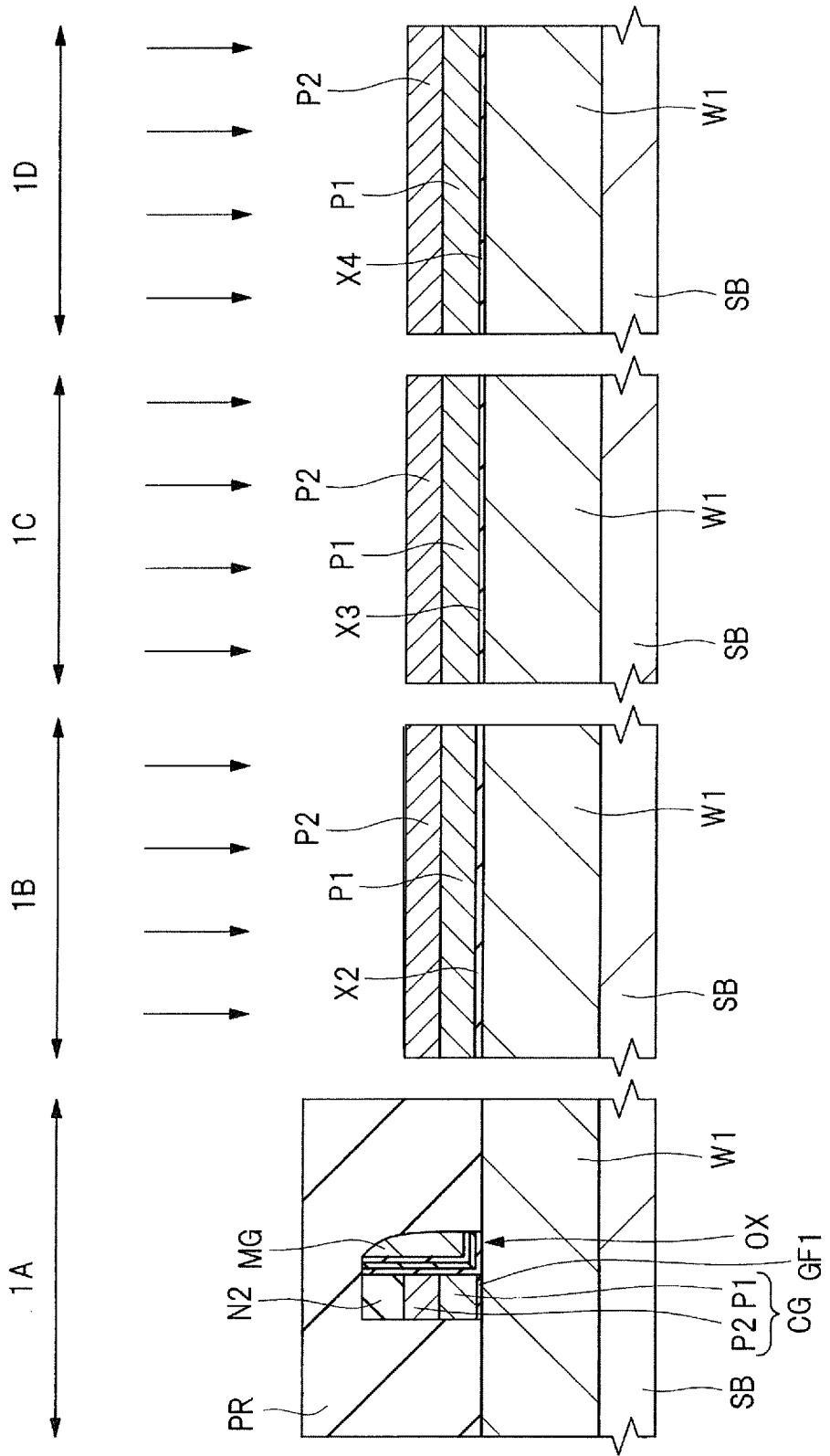
FIG. 9 is a cross-sectional view showing the method of manufacturing the semiconductor device following that of FIG. 8.

Next, as shown in FIG. 9, the MONOS memory formation region 1A is covered with a photoresist film PR and with the photoresist film PR as a mask, an n type impurity (for example, As (arsenic) or P (phosphorus)) is injected into the polysilicon films P1 and P2 from above the polysilicon film P2 by ion implantation. Then, in a p channel type MOSFET formation region (not illustrated), a p type impurity (for example, B (boron)) is injected into the polysilicon films P1 and P2 by ion implantation.

Figure 10:
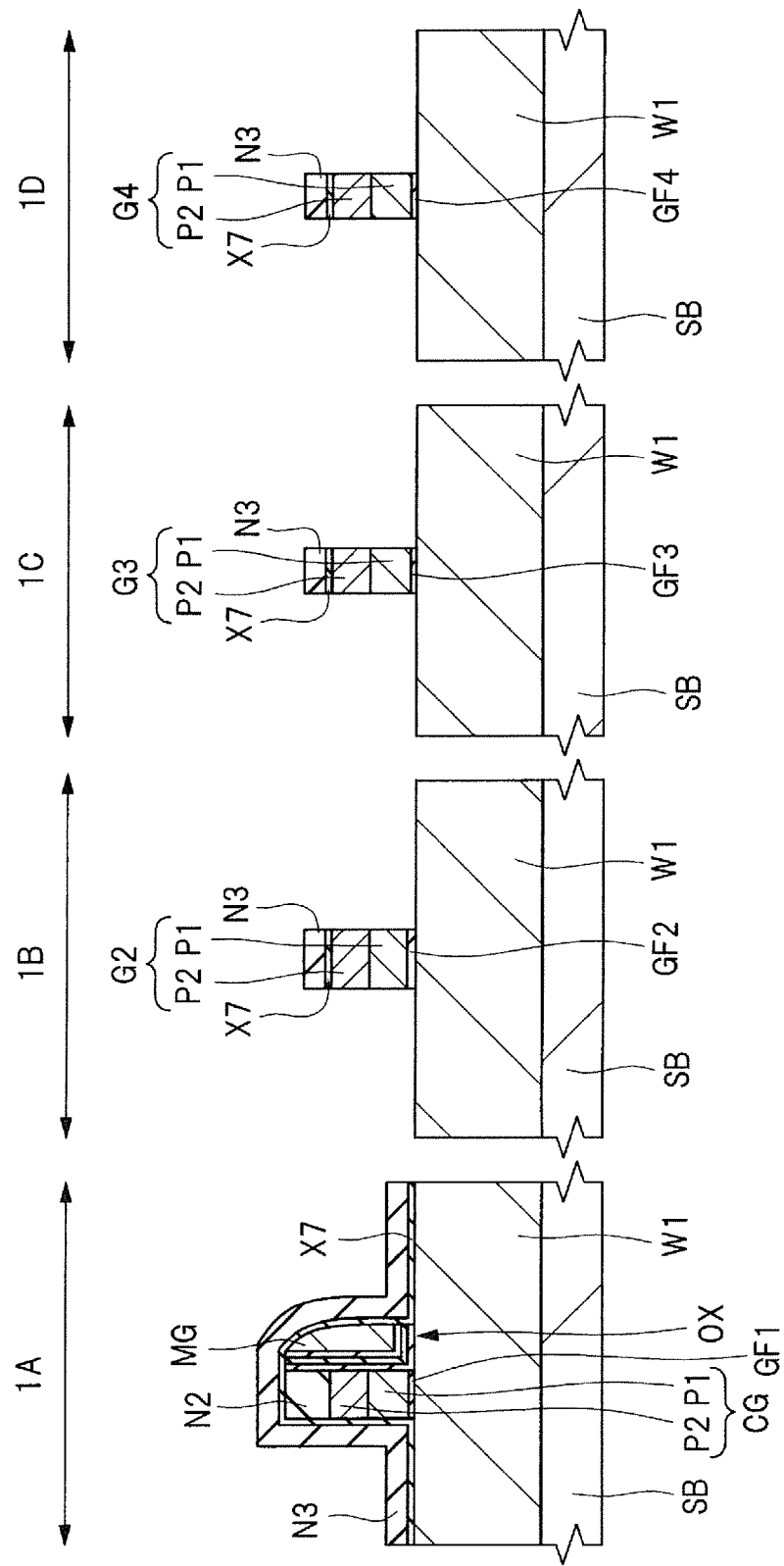
FIG. 10 is a cross-sectional view showing the method of manufacturing the semiconductor device following that of FIG. 9.
Figure 11:
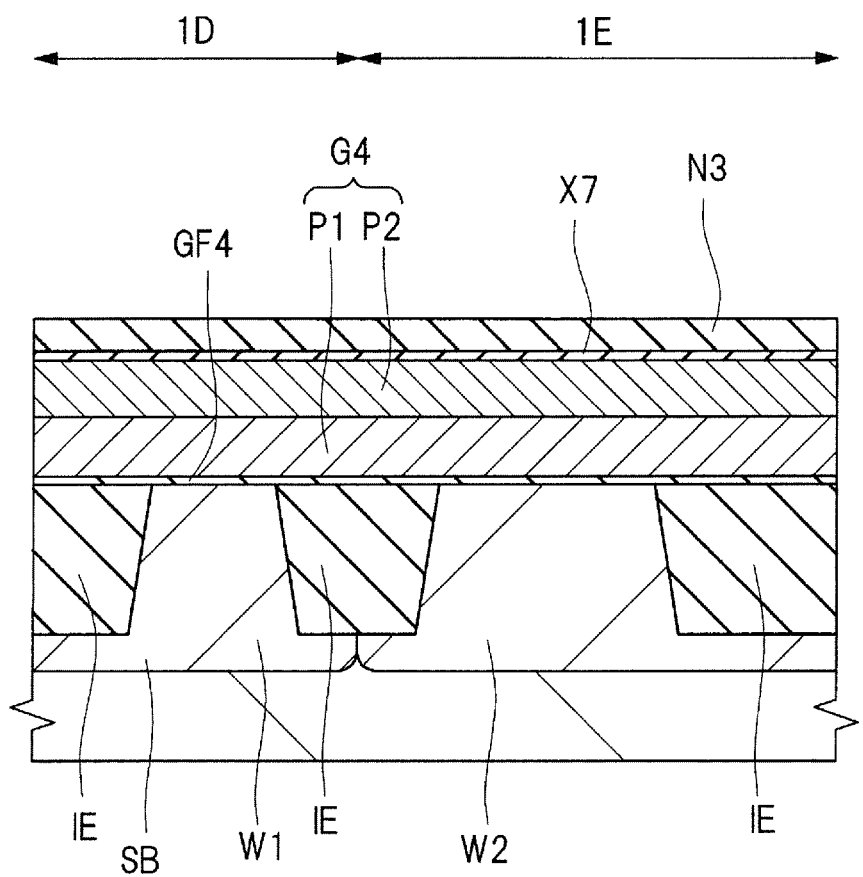
FIG. 11 is a cross-sectional view showing the method of manufacturing the semiconductor device following that of FIG. 9.

Next, as shown in FIGS. 10 and 11, after removal of the photoresist film PR by using ashing, a silicon oxide film X7 and a silicon nitride film N3 are formed (deposited) successively on the entire main surface of the semiconductor substrate SB by using, for example, CVD. The silicon oxide film X7 is made of a TEOS (tetra ethyl ortho silicate). Then, a planarization step may be conducted to retreat the uppermost surface of the silicon nitride film N3 in the MONOS memory formation region 1A with a view to making equal the height of all the structures on the main surface of the semiconductor substrate SB as much as possible, because the height of the film stack pattern including the control gate electrode CG and the silicon nitride film N2 is higher than the height of the film stack including the polysilicon films P1 and P2 in the other regions.

FIG. 10 is a cross-sectional view showing the same regions as those of FIG. 9 and FIG. 11 shows a cross-section passing through the SRAM MOSFET formation region 1D and it is a cross-section in a direction perpendicular to the cross-section shown in FIG. 10. Here, referring to FIG. 10, a manufacturing step following that of FIG. 9 will be described first.

Then, as shown in FIG. 10, photolithography and etching are conducted to pattern the silicon nitride film N3 in the high breakdown MOSFET formation region 1B, the low breakdown voltage MOSFET formation region 1C, and the SRAM MOSFET formation region 1D. Then, the photoresist film is removed and with the silicon nitride film N3 as a hard mask, the silicon oxide film X7, the polysilicon films P2 and P1, and the silicon oxide films X2, X3, and X4 are removed. As a result, a gate insulating film GF2 made of the silicon oxide film X2 is formed on the semiconductor substrate SB in the high breakdown voltage MOSFET formation region 1B. In addition, a gate insulating film GF3 made of the silicon oxide film X3 is formed on the semiconductor substrate SB in the low breakdown voltage MOSFET formation region 1C. Further, a gate insulating film GF4 made of the silicon oxide film X4 is formed on the semiconductor substrate SB in the SRAM MOSFET formation region D1.

The gate insulating film GF2 formed by the above-mentioned patterning is a silicon oxide film having a thickness greater than that of the gate insulating films GF1, GF3, and GF4. Immediately above the gate insulating films GF2, GF3, and GF4, gate electrodes G2, G3, and G4 made of a stack of the polysilicon films P1 and P2 are formed, respectively. The control gate electrode CG, the gate electrode G2, and the gate insulating films GF1 and GF2 are formed with a width in a gate length direction greater than the width in a gate length direction of the gate electrodes G3 and G4 and the gate insulating films GF3 and GF4.

Then, activation annealing at about 950° C. is conducted to diffuse the impurities, which have been injected in the ion implantation step described referring to FIG. 9, inside the gate electrodes G2, G3, and G4, respectively. This activation annealing is diffusion annealing to be conducted in order to diffuse the impurity in the vicinity of the bottom surface of the gate electrode and thereby prevent the depletion of the gate electrode and prevent an increase in the threshold voltage of the MOSFETs during operation of the MOSFET formed in a later step.

The above-mentioned heat treatment may be conducted not after patterning for forming each of the gate electrodes as described referring to FIG. 10 but before the patterning step of FIG. 10 after the ion implantation step of FIG. 9. Activation annealing before the patterning increases the diffusion amount of the impurity in the polysilicon film in a horizontal direction (direction along the main surface of the semiconductor substrate SB) and there is a possibility of a decrease in the amount of the impurity remaining in the gate electrode after processing. It is therefore possible to prevent reduction in the amount of the impurity in the gate electrode by conducting activation annealing after formation of each of the gate electrodes.

Activation annealing before processing of the gate electrode increases the amount of impurities that move in the horizontal direction so that it causes a variation in the impurity concentration in the polysilicon film between the p channel type MOSFET formation region and the n channel type MOSFET formation region. When there appears a variation in the impurity concentration, depending on the position in the polysilicon film which will configure a gate electrode and such a polysilicon film is processed into a gate electrode, a variation in the processing size of the polysilicon film occurs due to the variation in the impurity concentration. As a result, there is a possibility of the MOSFETs varying in characteristics due to the variation in the processing size of the gate electrode. It is therefore possible to prevent a variation in the processing size of the gate electrode and provide a semiconductor device having improved reliability by conducting processing of the gate electrode prior to activation annealing.

A cross-sectional view of the SRAM MOSFET formation region along a longer direction of the gate electrode, that is, in a gate width direction is shown in FIG. 11. FIG. 11 is a cross-sectional view showing the semiconductor device during a manufacturing step when the step described referring to FIG. 10 has finished. As shown in FIG. 11, the semiconductor substrate SB has, in the main surface thereof, an element isolation region 1E and with it, the SRAM MOSFET formation regions 1D and 1E on the semiconductor substrate SB are isolated from each other. Here, the SRAM MOSFET formation region 1D is an n channel type MOSFET formation region, while the SRAM MOSFET formation region 1E is a p channel type MOSFET formation region.

The upper surface of the semiconductor substrate SB in the SRAM MOSFET formation regions 1D and 1E is partitioned with the element isolation region 1E and in the SRAM MOSFET formation region 1D, the semiconductor substrate SB has, in the main surface thereof, a p well W1 having a p type impurity (for example, B (boron)) introduced. In the SRAM MOSFET formation region 1E, the semiconductor substrate SB has, in the main surface thereof, an n type well W2 having an n type impurity (for example, As (arsenic) or P (phosphorus)) introduced.

The gate electrode G4 extends over the element isolation region 1E and lies immediately above the SRAM MOSFET formation regions 1D and 1E. This means that the n channel type MOSFET formed in the SRAM MOSFET formation region 1D and the p channel type MOSFET formed in the SRAM MOSFET formation region 1E shown in FIG. 11 have the gate electrode G4 in common. The gate electrode G4 shown in FIG. 10 is a cross-sectional view of the gate electrode G4 immediately above the p well W1 of the SRAM NOSFET formation region 1D shown in FIG. 11. It is to be noted that the gate width of the gate electrode G4 of the n channel type MOSFET shown in FIG. 11, that is, the width of the upper surface of the p well W1 which will be a channel region of the above-mentioned n channel type MOSFET including the gate electrode G4 and the active region exposed from the element isolation region 1E in a longer direction of the gate electrode G4 is, for example, 68 nm.

Comparison between the structure shown in FIG. 11 and the SRAM described referring to FIGS. 3 and 4 shows that the p well W1 corresponds to the active region An1 and the n well W2 corresponds to the active region Ap1. As shown in FIG. 11, in the SRAM MOSFET formation region 1D which is a region for forming an n channel type MOSFET, an n type impurity (for example, As (arsenic) or P (phosphorus)) has been implanted into the gate electrode G4, while in the SRAM MOSFET formation region 1E which is a region for forming a p channel type MOSFET, a p type impurity (for example, B (boron)) has been implanted into the gate electrode G4.

As described above referring to FIGS. 5 to 11, in the present embodiment, the control gate electrode CG, and the gate electrode G2, G3, and G4 are made of the same layer, that is, the polysilicon films P1 and P2 (refer to FIG. 9). Before processing of the polysilicon films P1 and P3 into the gate electrodes G2, G3, and G4, the control gate electrode CG, the ONO film OX, and the memory gate electrode MG in the MONOS memory formation region 1A are formed. After nitriding treatment for the formation of the ONO film OX, an impurity is injected into the polysilicon films P1 and P2 (refer to FIG. 9) in the high breakdown voltage MOSFET formation region 1B, the low breakdown voltage MOSFET formation region 1C, and the SRAM MOSFET formation region 1D.

Figure 19:
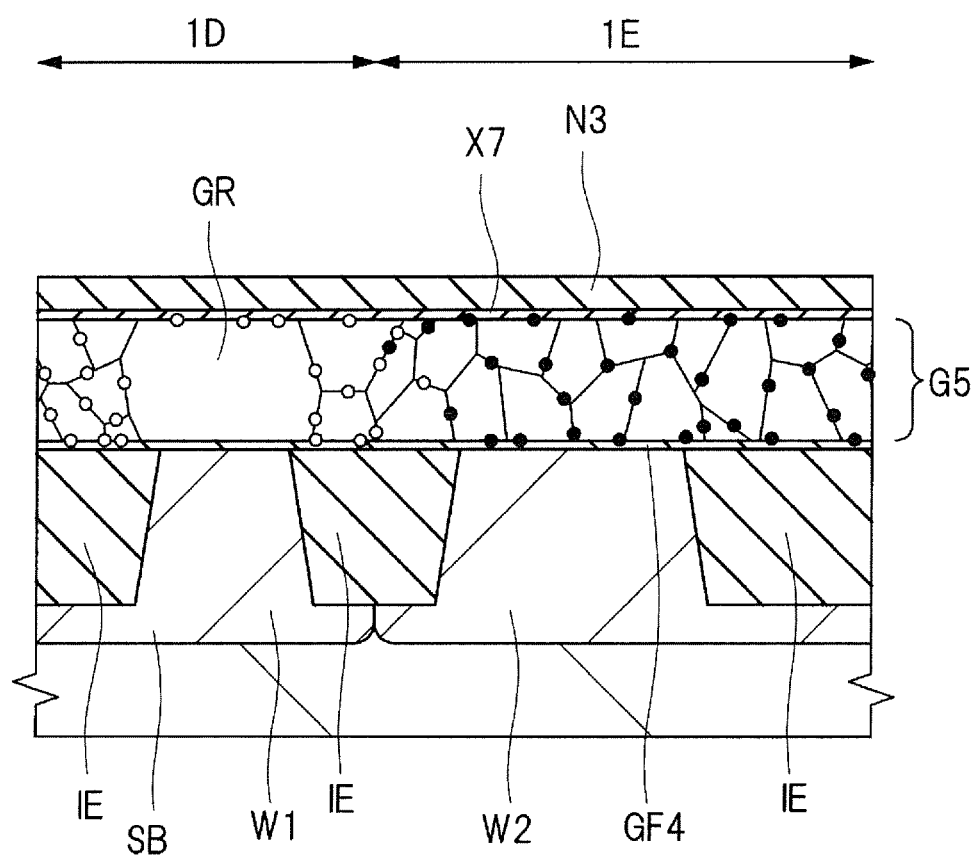
FIG. 19 is a cross-sectional view for describing a manufacturing step of a semiconductor device shown as Comparative Example.

When a nonvolatile memory and MOSFETs are formed on the semiconductor substrate by using the above-mentioned steps and the gate electrodes of the MOSFETs are comprised of a single polysilicon film layer, the problem as will be described referring to FIG. 19 may occur. FIG. 19 shows, as a comparative example, a semiconductor device during a manufacturing step and it is a cross-sectional view showing a gate electrode G5 of a SRAM MOSFET. The region shown in FIG. 19 corresponds to the region shown in FIG. 11 and FIG. 19 is a cross-sectional view along the gate width direction of the gate electrode G5. The structure shown in FIG. 19 is similar to the structure shown in FIG. 11 except that the gate electrode G5 is comprised of a single polysilicon film layer, and the grain configuring the gate electrode G5 has a different size. In FIG. 19, the individual grain forms in the gate electrode G5 are shown without hatching the polysilicon film configuring the gate electrode G5, while the grain is not illustrated in FIG. 11.

By the nitriding treatment to be conducted to form the silicon nitride film configuring the ONO film, the whole semiconductor substrate SB is exposed to a high temperature of about 1000° C. so that crystals configuring the polysilicon film which is the same layer as the control gate electrode grow large. By the high temperature during the nitriding treatment, a grain GR large enough to block the upper surface of the p well W1 which is an active region in the gate width direction has been formed in the gate electrode G5. This means that in the longer direction of the gate electrode G5, the width of the grain GR is greater than the width of the active region immediately therebelow.

In the gate electrode G5 shown in FIG. 19, open circles and filled circles show impurities injected into the gate electrode G5. The open circles show an n type impurity (for example, As (arsenic) or P (phosphorus)) and the filled circles show a p type impurity (for example, B (boron)).

As shown in FIG. 19, even if an impurity is injected into the polysilicon film containing a large crystal of the grain GR by ion implantation in a step similar to that described using FIG. 9, it is blocked by the large grain GR so that in a region in which the large grain GR has been formed, the impurity is not injected into the lower portion of the polysilicon film. In addition, after the ion implantation, the gate electrode G5 is heated to about 950° C. to diffuse the impurity in the gate electrode G5, the impurity which mainly diffuses through the grain boundary hardly moves in a region having the grain GR which has grown large.

In other words, even if ion implantation into the polysilicon film containing the grain GR is conducted from above the polysilicon film, in the region having the grain GR, the impurity is injected into the surface on the grain GR and no impurity is injected into a region immediately below the surface. Even in such a case, there occurs no problem if the impurity existing in the surface on the grain GR diffuses to the lower portion of the polysilicon film (gate electrode G5) by the activation annealing conducted subsequently, but the impurity in the surface on the grain GR cannot diffuse into a region right therebelow. In the region having the huge grain GR, the impurity hardly diffuses in the vicinity of the lower surface of the gate electrode G5.

Upon operation of a MOSFET, if no impurity has been introduced into the vicinity of the bottom surface of the gate electrode made of polysilicon, that is, in the gate electrode in the vicinity of the boundary between the gate electrode and the gate insulating film immediately above the channel region of the MOSFET, depletion of the gate electrode and increase in threshold voltage may presumably occur. In particular, with the scaling down of semiconductor devices, there is a possibility of one grain GR covering a region immediately above the upper surface of the p well W1 which is an active region as shown in FIG. 19. In this case, a change in threshold voltage becomes eminent.

The growing degree of the grain due to high heat during nitriding treatment is uncertain and differs, depending on the position so that the threshold voltage varies among the MOSFETs. Such variation in the characteristic of the MOSFET directly leads to deterioration in the reliability of a semiconductor device so that diffusion of an impurity should be expanded to the bottom portion of the gate electrode even if nitriding treatment for the formation of a nonvolatile memory is conducted before ion implantation and activation annealing of the gate electrode of the MOSFET as described above.

A decrease in nitriding temperature and a decrease in heating time upon formation of the nonvolatile memory can be considered as a countermeasure for overcoming the above-mentioned problem but such a countermeasure may deteriorate the performance of the nonvolatile memory and also deteriorate the reliability of the semiconductor device.

On the other hand, when the energy for ion implantation into the polysilicon film configuring the gate electrode is increased or the impurity concentration is increased as a countermeasure, there is a possibility of the impurity ion penetrating through the gate electrode and reaching the gate insulating film and the semiconductor substrate.

Heat treatment at a temperature higher than the activation annealing temperature can be considered as a measure for diffusing the impurity injected into the gate electrode in which a huge grain has been formed. When the heat treatment temperature is increased, however, in the gate electrode G5 configuring the SRAM as shown in FIG. 19, there is a possibility of the n type impurity (an open circle shown in the diagram) in the gate electrode G5 in the SRAM MOSFET formation region 1D diffusing in the gate electrode G5 in the SRAM MOSFET formation region 1E. On the contrary, there is a possibility of the p type impurity (filled circle shown in the diagram) in the gate electrode G5 in the SRAM MOSFET formation region 1E diffusing in the gate electrode G5 in the SRAM MOSFET formation region 1D.

Interdiffusion in the gate electrode may cause deterioration in the performance of each MOSFET, leading to deterioration in the reliability of the semiconductor device. Such a problem of interdiffusion occurs not only in the SRAM but may similarly occur in an element such as CMOS inverter in which an n channel type MOSFET and a p channel type MOSFET have one gate electrode in common.

In the present embodiment, in order to suppress the grain from growing during nitriding treatment, the polysilicon film configuring the gate electrode is formed as a stack structure of two polysilicon film layers. As shown in FIG. 11, the film thickness of each of the polysilicon films P1 and P2 is smaller than the film thickness of the gate electrode formed as a single layer so that the degree of freedom of the grain growth decreases and a growing amount of the grain can be reduced even if the grain is exposed to a high nitriding treatment temperature.

Prevention of the grain growth facilitates diffusion of the impurity even to the bottom portion of the gate electrode G4 when ion implantation (refer to FIG. 9) into the polysilicon film configuring the gate electrode G4 is conducted and the impurity thus injected by the ion implantation is diffused by heat treatment. This makes it possible to prevent depletion of the gate electrode G4 and variation in the threshold voltage of the MOSFET. As a result, a semiconductor device having improved reliability can be provided.

Such an effect can be produced not only in the MOSFET configuring the SRAM but also in the high breakdown voltage MOSFET and the low breakdown voltage MOSFET. In particular, in the MOSFET having an active region with a small width in a gate width direction, a change in the characteristics of the element is marked when the grain grows large so that the prevention of the grain growth is significantly effective. Also in the control gate electrode CG of the MONOS memory formation region 1A, it can prevent a variation in the threshold voltage so that a semiconductor device having improved reliability can be obtained.

Further, a change in the conditions of ion implantation to the gate electrode or increase in the annealing temperature for diffusing is not required so that the above-mentioned problem of interdiffusion can be prevented and a semiconductor device having improved reliability can be provided.

Figure 12:
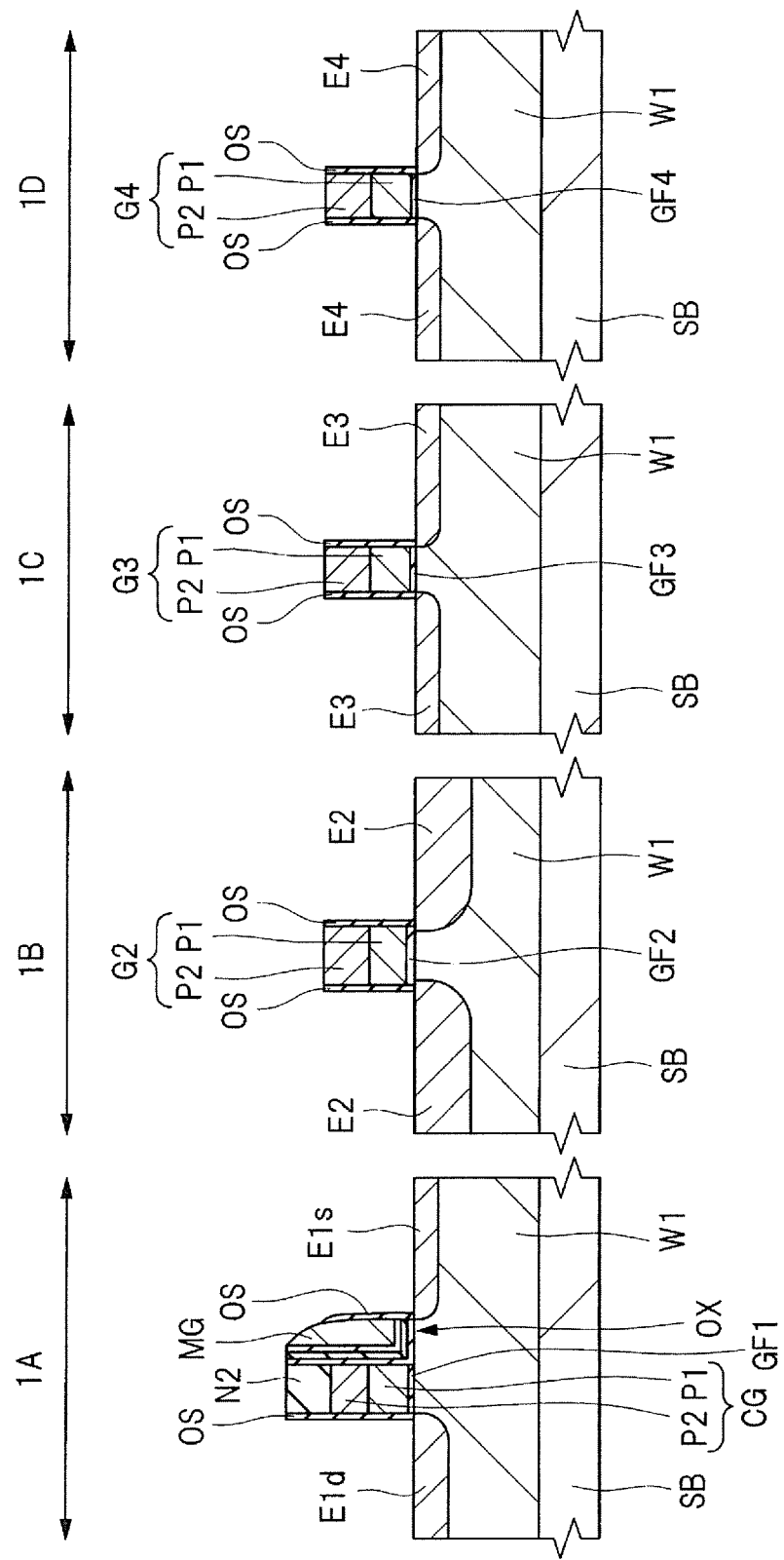
FIG. 12 is a cross-sectional view showing the method of manufacturing the semiconductor device following that of FIG. 10.

Next, as shown in FIG. 12, $n^-$ type semiconductor regions E1$s$, E1$d$, E2, E3, and E4 are formed in the main surface of the semiconductor substrate SB in each region. Described specifically, by using a photoresist film (not illustrated), only the high breakdown voltage MOSFET formation region 1B is exposed and with this photoresist film and the silicon nitride film N3 (refer to FIG. 10) as masks, an n type impurity (for example, As (arsenic) or P (phosphorus)) is ion-implanted into the main surface of the semiconductor substrate SB at a relatively low concentration to form an $n^-$ type semiconductor region E2 in the main surface of the semiconductor substrate SB on the side of the gate electrode G2.

Then, the photoresist film is removed, followed by removal of the silicon nitride film N3 and the silicon oxide film X7. A silicon oxide film is then formed on the entire main surface of the semiconductor substrate SB by using CVD or the like method. A portion of the silicon oxide film is then removed by using dry etching or the like method to expose the upper surfaces of the memory gate electrode MG and the gate electrodes G2 to G4. As a result, an offset spacer OS made of the silicon oxide film is formed on one of the sidewalls of the control gate electrode CG, on one of the sidewalls of the memory gate electrode MG, and on the sidewall on both sides of the gate electrodes G2 to G4.

Then, $n^-$ type semiconductor regions E1$s$ and E1$d$ are formed in the main surface of the semiconductor substrate SB in MONOS memory formation region 1A by using photolithography and ion implantation. The $n^-$ type semiconductor regions E1$d$ is formed in the main surface of the semiconductor substrate SB in a region adjacent to the control gate electrode CG, while the $n^-$ type semiconductor region E1$s$ is formed in the main surface of the semiconductor substrate SB in a region adjacent to the memory gate electrode MG. Here, the $n^-$ type semiconductor region E1$d$ is formed with a junction depth shallower than that of the $n^-$ type semiconductor region E2 and the $n^-$ type semiconductor region E1$s$ is formed with a junction depth shallower than the $n^-$ type semiconductor region E1$d$.

Then, a pair of $n^-$ type semiconductor regions E3 is formed in the main surface of the semiconductor substrate SB on the side of the gate electrode G3 in the low breakdown voltage MOSFET formation region 1C by using photolithography and ion implantation. The $n^-$ type semiconductor region E3 is formed with a junction depth shallower than that of the $n^-$ type semiconductor region E2.

Then, a pair of $n^-$ type semiconductor regions E4 is formed in the main surface of the semiconductor substrate SB on the side of the gate electrode G4 in the SRAM MOSFET formation region 1D by using photolithography and ion implantation. The n⁻ type semiconductor region E4 is formed with a junction depth shallower than that of the n⁻ type semiconductor region E2. In an unillustrated region, a p type impurity (for example, B (boron)) is injected into the upper surface of the n well having the gate electrode G4 immediately thereabove by using ion implantation to form a pair of p⁻ type semiconductor regions.

Figure 13:
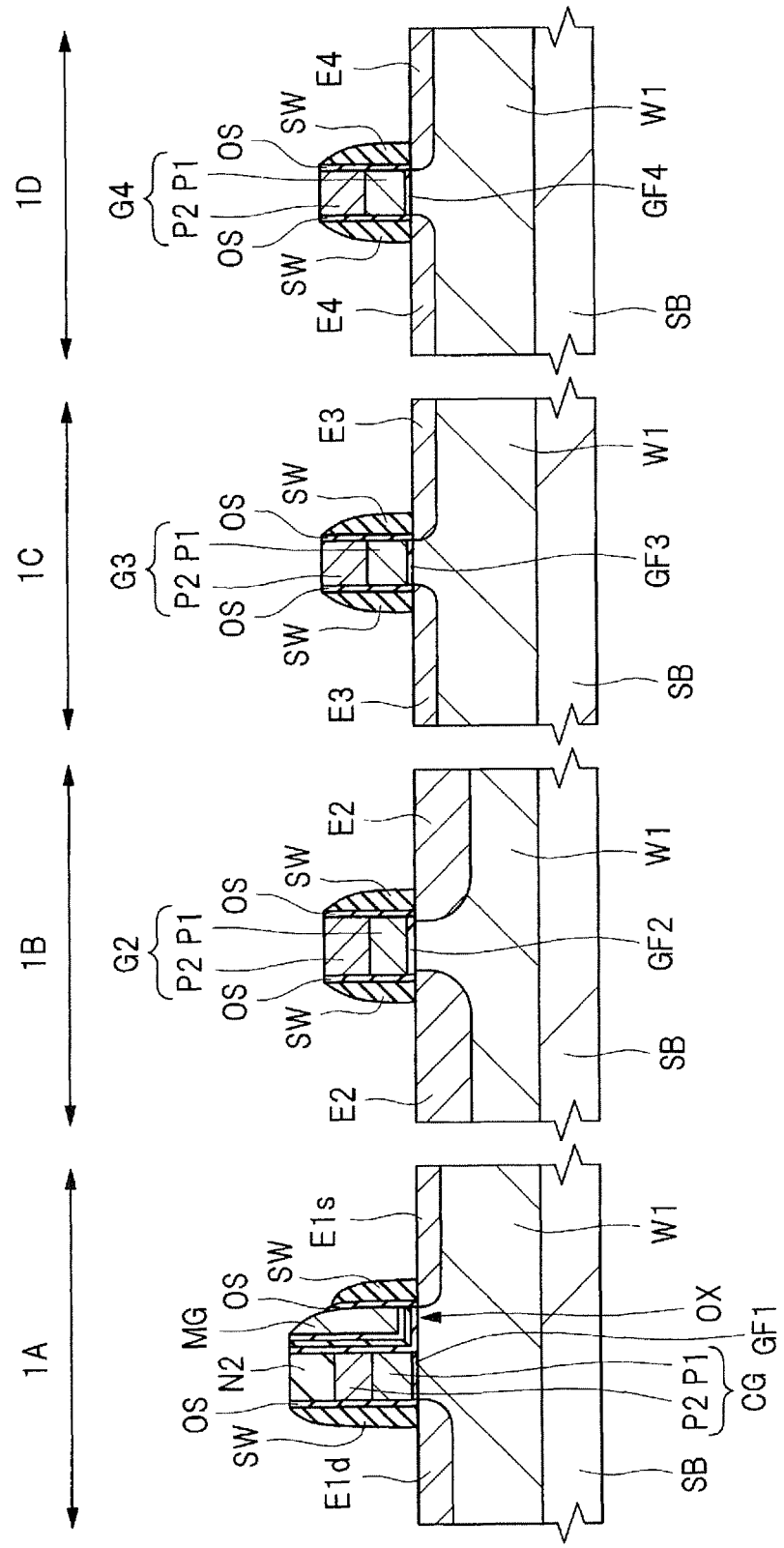
FIG. 13 is a cross-sectional view showing the method of manufacturing the semiconductor device following that of FIG. 12.

Next, as shown in FIG. 13, for example, a silicon oxide film is formed using CVD on the entire main surface of the semiconductor substrate SB. A portion of the resulting silicon oxide film is then removed using dry etching or the like method to expose the respective upper surfaces of the memory gate electrode MG and the gate electrodes G2 to G4. As a result, a sidewall SW made of the silicon oxide film is formed via the offset spacer OS on one of the sidewalls of the control gate electrode CG, one of the sidewalls of the memory gate electrode MG, and the side wall on both sides of the gate electrodes G2 to G4. The insulating film configuring the sidewall SW is not limited to the silicon oxide film and alternatively, it may be a stack of a silicon oxide film and a silicon nitride film.

Figure 14:
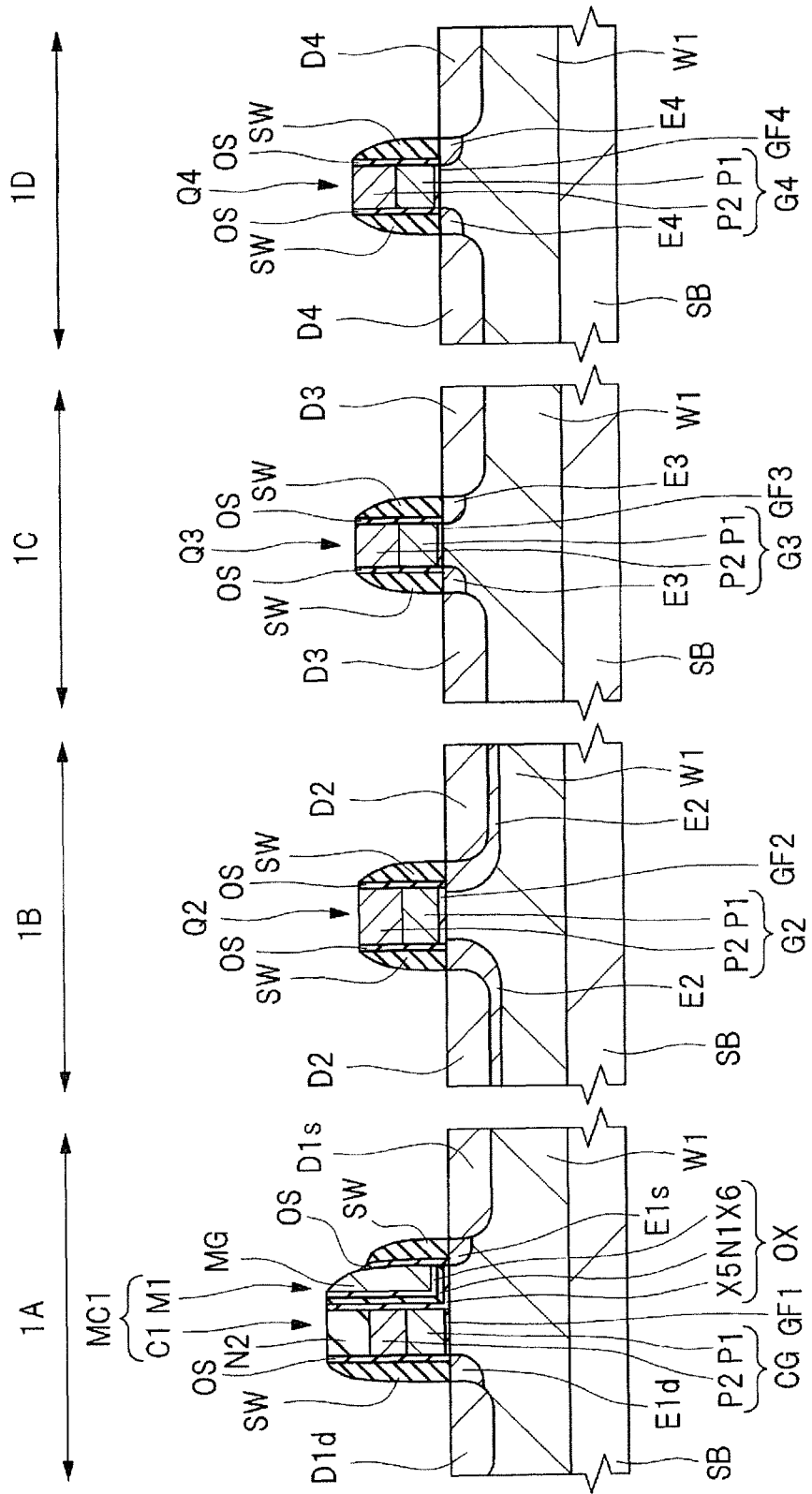
FIG. 14 is a cross-sectional view showing the method of manufacturing the semiconductor device following that of FIG. 13.

Next, as shown in FIG. 14, with the silicon nitride film N2 and each of the gate electrodes and sidewalls as a mask, an n type impurity (for example, As (arsenic) or P (phosphorus)) is ion-implanted into the main surface of the semiconductor substrate SB at a relatively high concentration to form n⁺ type semiconductor regions D1d, D1s, and D2 to D4. The dosage of the impurity in this ion implantation is larger than that in the ion implantation for forming the extension regions (n⁻ type semiconductor regions E1d, E1s, and E2 to E4).

The n⁺ type semiconductor region D1d is formed in the main surface of the semiconductor substrate SB in a region adjacent to the control gate electrode CG, while the n⁺ type semiconductor region D1s is formed in the main surface of the semiconductor substrate SB in a region adjacent to the memory gate electrode MG. The n⁺ type semiconductor regions D2 to D4 are formed in the main surface of the semiconductor substrate SB on the sides of the gate electrodes G2 to G4, respectively. By a separate step, in an unillustrated p channel type MOSFET formation region, a p type impurity (for example, B (boron)) is ion-implanted in the main surface of the semiconductor substrate SB at a relatively high concentration to form p⁺ type semiconductor regions functioning as a source/drain region.

The n⁻ type semiconductor regions E1d, E1s, and E2 to E4 are extension regions for relaxing the electric field at the edge of the n⁺ semiconductor regions D1d, D1s, and D2 to D4, respectively. The n⁻ type semiconductor regions E1d, E1s, and E2 to E4 are semiconductor regions with an impurity concentration lower than that of the n⁺ type semiconductor regions D1d, D1s, and D2 to D4, The n⁺ type semiconductor regions D1d and D1s are semiconductor regions functioning as a drain region and a source region, respectively. The n⁺ type semiconductor regions D2 to D4 are semiconductor regions functioning as a source/drain region, respectively.

Thus, the source/drain region in each region has an LDD structure in which it is contiguous to the extension region having a relatively low impurity concentration. Here, the n⁺ type semiconductor regions D1d, D1s and D2 to D4 have a depth smaller than that of the n⁻ type semiconductor region E2 and greater than that of the n⁻ type semiconductor regions E1d, E1s, E3, and E4.

Then, annealing is conducted to diffuse the impurity present inside the n⁺ type semiconductor regions D1d, D1s, and D2 to D4. The diffusion annealing conducted here is spike annealing, for example, at about 1040° C. for a short time. Also in this diffusion annealing, grains in the polysilicon film configuring each of the gate electrodes may grow. The impurity in each of the gate electrodes has finished diffusion as a result of the above-mentioned activation annealing at 950° C. so that even the grain growth in the diffusion annealing for diffusing the impurity in the n⁺ type semiconductor region does not cause the problem of diffusion failure in the gate electrode.

By the above-mentioned steps, the memory cell MC1 which is a MONOS memory including the control gate electrode CG, memory gate electrode MG, ONO film OX, n⁺ type semiconductor regions D1d and D1s is formed in the MONOS memory formation region 1A. The memory cell MC1 includes a control transistor C1 including the control gate electrode CG and n⁺ type semiconductor regions D1d and D1s and a memory transistor M1 including the memory gate electrode MG, the ONO film OX, and the n⁺ type semiconductor regions D1d and D1s. A memory cell MC2 is also formed adjacent to the memory cell MC1 as shown in FIG. 1.

In the high breakdown voltage MOSFET formation region 1B, a high breakdown voltage MOSFET Q2 including the gate electrode G2 and the n⁺ type semiconductor regions (source/drain region) D2 is formed. The high breakdown voltage MOSFET Q2 is, for example, an element to be used in a circuit engaged in input/output of an electric current between a semiconductor device and an external device. It has therefore a gate length greater than that of the other MOSFET and has a relatively thick gate insulating film GF2.

In the low breakdown voltage MOSFET formation region 1C, a low breakdown voltage MOSFET Q3 including the gate electrode G3 and the n⁺ type semiconductor regions (source/drain region) D3 is formed. This low breakdown voltage. MOSFET Q3 is, for example, an element that configures a logic circuit and is required to operate at high speed. The drive voltage of the low breakdown voltage MOSFET Q3 is lower than that of the high breakdown voltage MOSFET Q2 and the breakdown voltage of it is also lower than that of the high breakdown voltage MOSFET Q2.

As described below, the MOSFET Q4 and a MOSFET having a different conductivity type have the gate electrode G4 in common, but the gate electrode G3 configuring a portion of the low breakdown voltage MOSFET Q3 does not configure a portion of a MOSFET having a conductivity type (p channel type) different from that of the n channel type low breakdown voltage MOSFET Q3. This means that no p type impurity (for example, B (boron)) has not been injected into the gate electrode G3 in the ion implantation step described referring to FIG. 9 and the gate electrode G3 is used only as a gate electrode of an n channel type MOSFET.

In the SRAM MOSFET formation region 1D, a MOSFET Q4 is formed. The MOSFET Q4 corresponds to, for example, the driver MOSFET Qd1 shown in FIGS. 3 and 4 and it is an element configuring SRAM. It is driven at a voltage lower than that of the high breakdown MOSFET Q2 shown in FIG. 14 and the breakdown voltage of it is lower than that of the high breakdown voltage MOSFET Q2. The gate electrode G4 configures a portion of the n channel type MOSFET Q4 and in addition, in another region not shown in FIG. 14, it configures a p channel type MOSFET, that is, a portion of the load MOSFET Qp1 shown in FIGS. 3 and 4. Thus, the gate electrode G4 configures a gate electrode of a CMOS inverter INV1 (refer to FIG. 3) comprised of the n channel type MOSFET and the p channel type MOSFET.

It is to be noted that as shown in FIGS. 3 and 4, the memory cell MC3 of the SRAM includes, in addition to the driver MOSFETs Qd1 and Qd2 and the load MOSFETs Qp1 and Qp2 in which the n channel type MOSFET and the p channel type MOSFET have a gate electrode in common, the transfer MOSFETs Qt1 and Qt2 in which the gate electrode is not shared by MOSFETs different in conductivity type.

The above-mentioned driver MOSFETs Qd1 and Qd2, the load MOSFETs Qp1 and Qp2, and the transfer MOSFETs Qt1 and Qt2 have, similar to the MOSFET Q4 shown in FIG. 14, a gate structure made of two polysilicon film layers. Further, the gate electrodes of the driver MOSFETs Qd1 and Qd2, the load MOSFETs Qp1 and Qp2, and the transfer MOSFETs Qt1 and Qt2 are made of a film stack of the same layer. The advantage of the present embodiment available using the above-mentioned gate electrode having a two layer structure can also be obtained not only in the gate electrode of the CMOS inverter INV1 (refer to FIG. 3) but also in any MOSFET configuring the memory cell MC3 of the SRAM.

One of the characteristics of the present embodiment is that as described above, upon formation of a nonvolatile memory and MOSFET that needs high-temperature nitriding treatment, the control gate electrode CG and the gate electrodes G2 to G4 are all made of films of the same layer and moreover, the control gate electrode CG and the gate electrodes G2 to G4 are each made of a film stack of two layers, that is, polysilicon films P1 and P2. This makes it possible to suppress the growth of grains in each of the gate electrodes during the nitriding treatment step, facilitate diffusion of the impurity in each of the gate electrodes, and thereby provide a semiconductor device having improved reliability.

The term "they are made of the same layer" as used herein means that they are made of the same layer before processing. The control gate electrode CG and the gate electrodes G2 to G4 shown in FIG. 14 are each obtained by processing a film stack composed of polysilicon films P1 and P2 formed in the step described referring to FIG. 6 so that they are made of the same layer.

In addition, as shown in FIG. 11, when an n channel type MOSFET and a p channel type MOSFET adjacent to each other have one gate electrode in common, an increase in activation annealing temperature to improve the reliability of a semiconductor device may cause interdiffusion of an impurity in the gate electrode between the n channel type MOSFET and p channel type MOSFET. On the other hand, in the present embodiment, by using a two-layer gate structure as described above, it is possible to improve the reliability of the semiconductor device and prevent the interdiffusion without increasing the diffusion annealing temperature.

Figure 15:
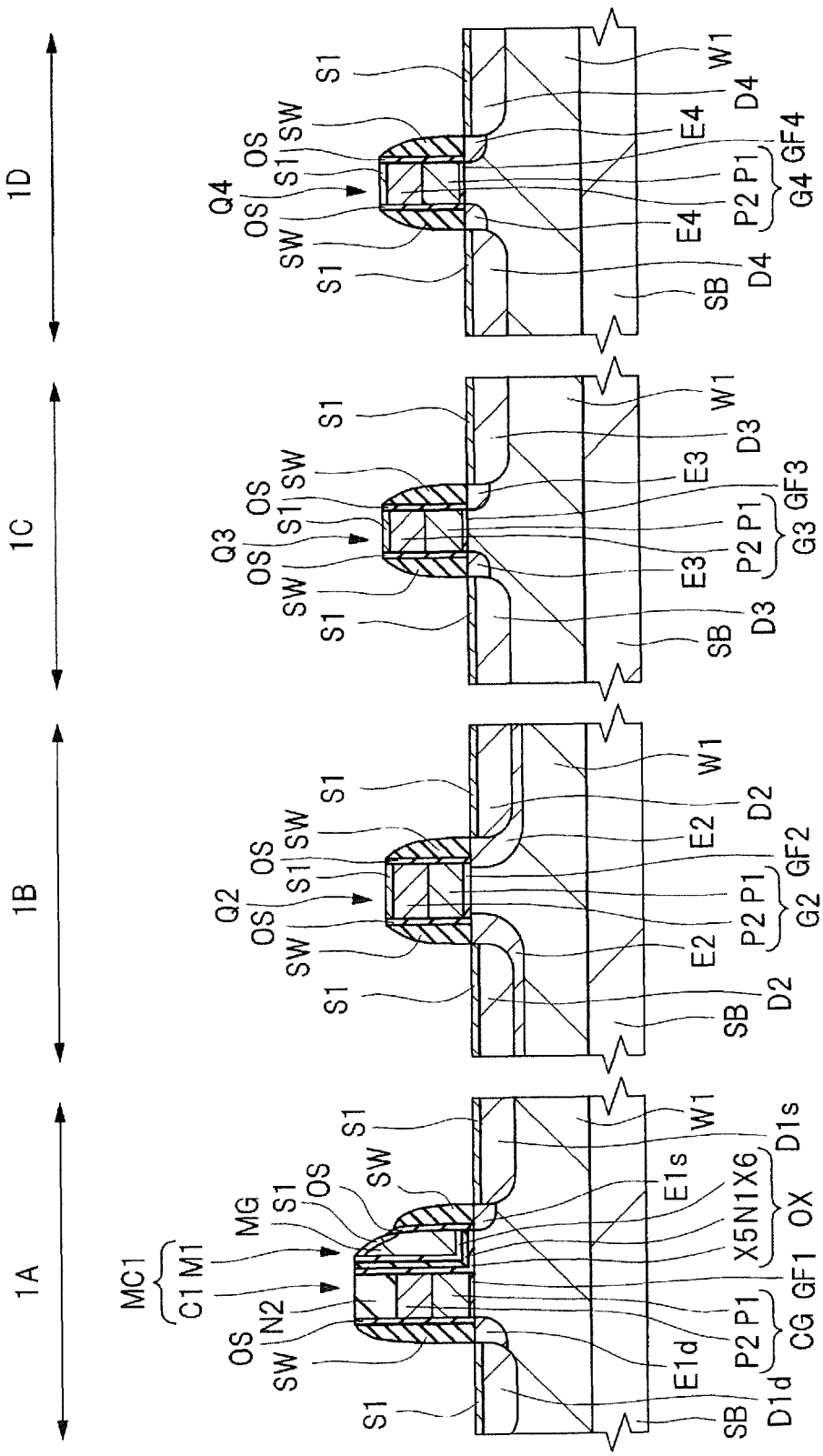
FIG. 15 is a cross-sectional view showing the method of manufacturing the semiconductor device following that of FIG. 14.

Next, as shown in FIG. 15, a silicide layer S1 is formed on the upper surface of each of the control gate electrode CG, the memory gate electrode MG, the gate electrodes G2 to G4, and the $n^+$ type semiconductor regions D1$d$ and D1$s$ and D2 to D4 by using a known salicide technology. A specific silicidation step includes depositing a metal film on the main surface of the semiconductor substrate SB by using sputtering, heat treating the semiconductor substrate SB to react the metal film with the semiconductor substrate SB, and removing an unreacted portion of the metal film by using wet etching to form the silicide layer S1. Examples of the member of the silicide layer S1 include nickel silicide, cobalt silicide, titanium silicide, and platinum silicide. It is to be noted that a silicide layer formed on the upper surface of the control gate electrode CG is not illustrated in the drawing.

Figure 16:
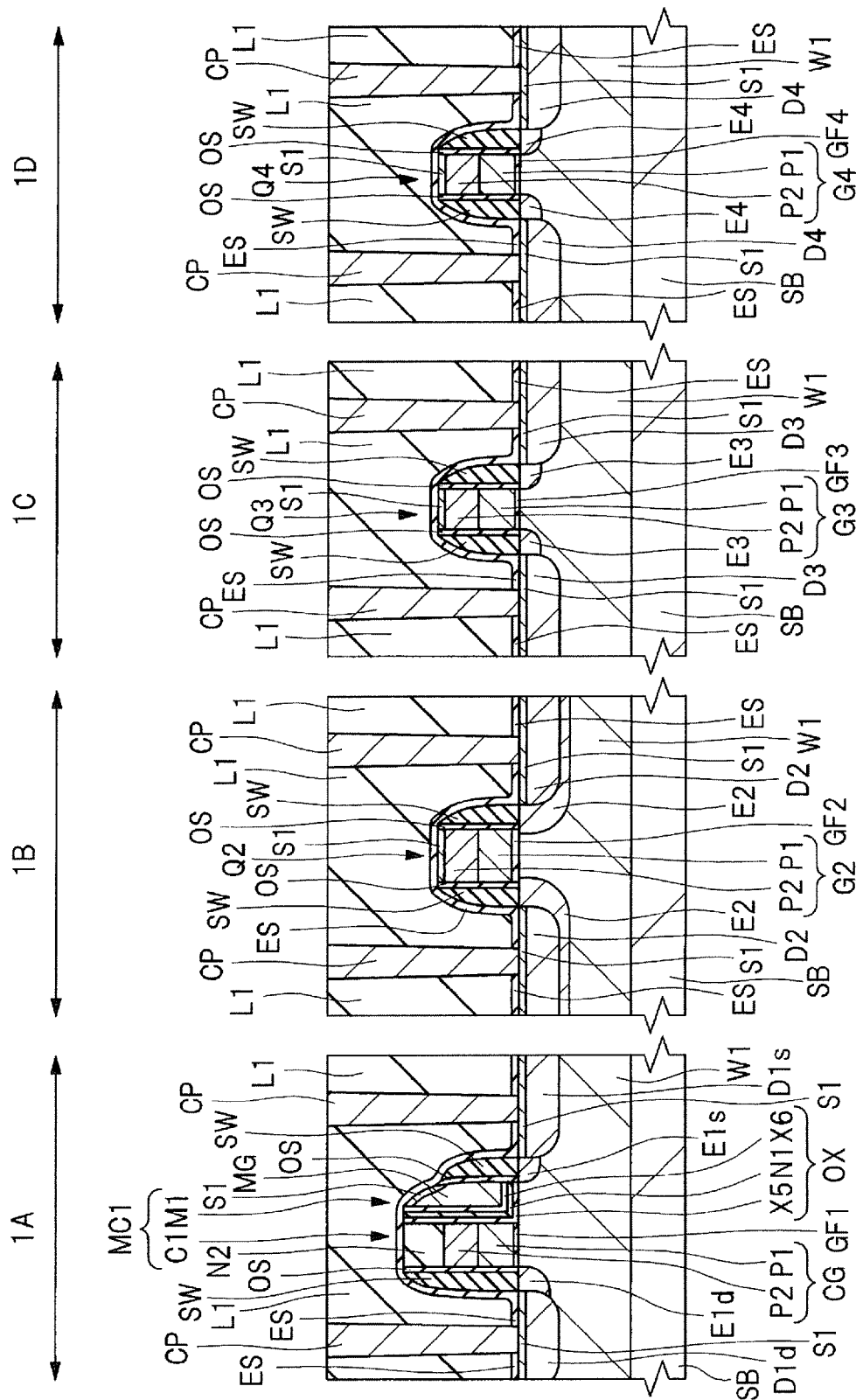
FIG. 16 is a cross-sectional view showing the method of manufacturing the semiconductor device following that of FIG. 15.

Next, as shown in FIG. 16, a stopper insulating film ES made of a silicon nitride film and an interlayer insulating film L1 made of a silicon oxide film are formed (deposited) successively on the entire main surface of the semiconductor substrate SB, for example, by using CVD. Then, the upper surface of the interlayer insulating film L1 is polished by using CMP to planarize the upper surface. Then, a contact hole penetrating through from the upper surface of the interlayer insulating film L1 to the back surface of the stopper insulating film ES and reaching the silicide layer S1 formed on the respective upper surfaces of the $n^+$ type semiconductor regions D1$d$, D1$s$, and D2 to D4. In an unillustrated region, a contact hole exposing therefrom the upper surface of the silicide layer S1 is formed immediately above each of the control gate electrode CG, the memory gate electrode MG, and the gate electrodes G2 to G4.

Then, after formation of a thin barrier conductor film such as titanium or titanium nitride in the contact hole by using sputtering, the contact hole is filled with a tungsten film. Then, the tungsten film on the interlayer insulating film L1 is removed using CMP to form a contact plug CP including the tungsten film for filling a plurality of contact holes therewith. In an unillustrated region, by the same step, a contact plug CP penetrating through the interlayer insulating film L1 and the stopper insulating film ES and reaching the silicide layer S1 formed on each of the control gate electrode CG, the memory gate electrode MG, and the gate electrodes G2 to G4 is formed.

Figure 17:
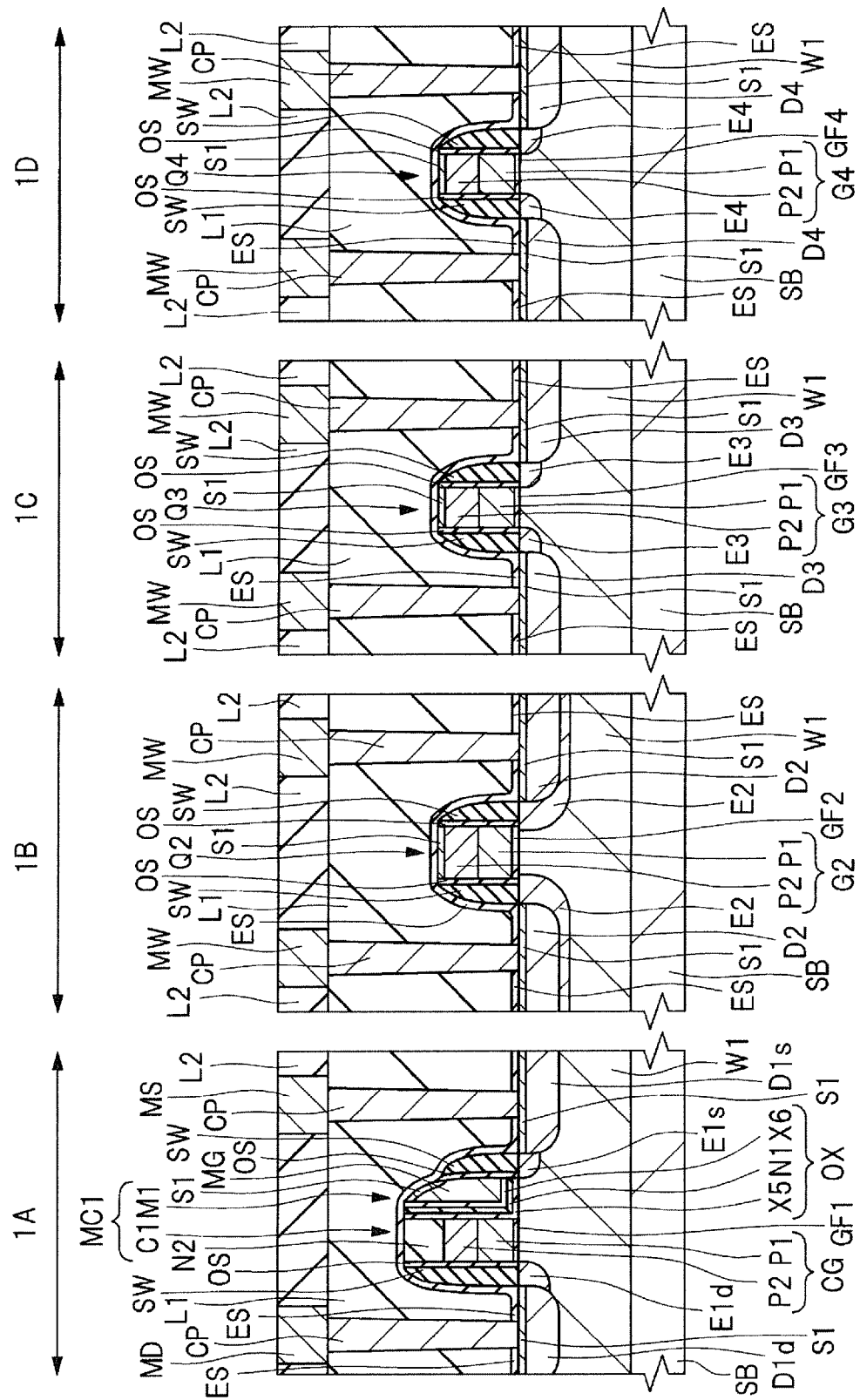
FIG. 17 is a cross-sectional view showing the method of manufacturing the semiconductor device following that of FIG. 16.

Next, as shown in FIG. 17, an interlayer insulating film L2 and metal wirings MD, MS, and MW are formed on the interlayer insulating film L1 and the contact plug CP by using the damascene process which is a known technology. As a result, the semiconductor device of the present embodiment is completed.

Described specifically, after formation of the interlayer insulating film L2 on the interlayer insulating film L1 and the contact plug CP by using CVD or the like method, the interlayer insulating film L2 is processed using photolithography and dry etching to form a wiring trench exposing therefrom the upper surface of the interlayer insulating film L1 and the contact plug CP. The interlayer insulating film L2 is an insulating film made of, for example, SiOC.

Then, after formation of a barrier conductor film made of tantalum (Ta), tantalum nitride (TaN), or the like or a film stack of them and a seed film made of copper (Cu) on the upper surface of the interlayer insulating film L2 and the inner wall and the bottom portion of the wiring trench by using sputtering or the like, a main conductor film having copper (Cu) as a principal component is formed by plating or the like. Then, the barrier conductor film, the seed film, and the main conductor film are polished using CMP to expose the upper surface of the interlayer insulating film L2. As a result, the metal wirings MD, MS, and MW are formed in the wiring trench penetrating through the interlayer insulating film L2.

The metal wiring MD is electrically coupled to the $n^+$ type semiconductor region (drain region) D1$d$, while the metal wiring MS is electrically coupled to the $n^+$ type semiconductor region (source region) D1$s$. The metal wiring MW is electrically coupled to the $n^+$ type semiconductor regions D2 to D4 which are source/drain regions.

By the above-mentioned steps, the semiconductor device of the present embodiment is completed. The memory cell MC1 shown in FIG. 1 corresponds to the memory cell MC1 shown in FIG. 2 and the MOSFET Q4 shown in FIG. 17 corresponds to the driver MOSFET Qd1 shown in FIGS. 3 and 4. This means that the gate electrode G4 shown in FIG. 17 corresponds to the gate electrode G1 immediately above the active region An1 shown in FIG. 4.

Second Embodiment

In First Embodiment, the polysilicon films P1 and P2 configuring the control gate electrode CG and the gate electrodes G2 to G4 shown in FIG. 17 have almost the same film thickness, while in the present embodiment, the thickness of a polysilicon film P1 is smaller than that of a polysilicon film P2. More specifically, the polysilicon film P1 has a film thickness of from 40 nm to 24 nm and the polysilicon film P2 has a film thickness of from 48 nm to 64 nm.

Figure 18A:
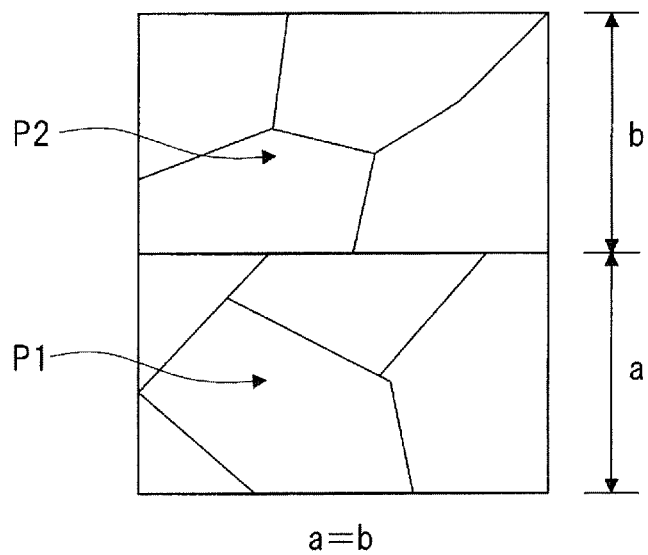
FIG. 18A is a cross-sectional view schematically showing the grain size of the stacked polysilicon films in First Embodiment and FIG. 18B is a cross-sectional view schematically showing the grain size of the stacked polysilicon film in Second Embodiment.
Figure 18B:
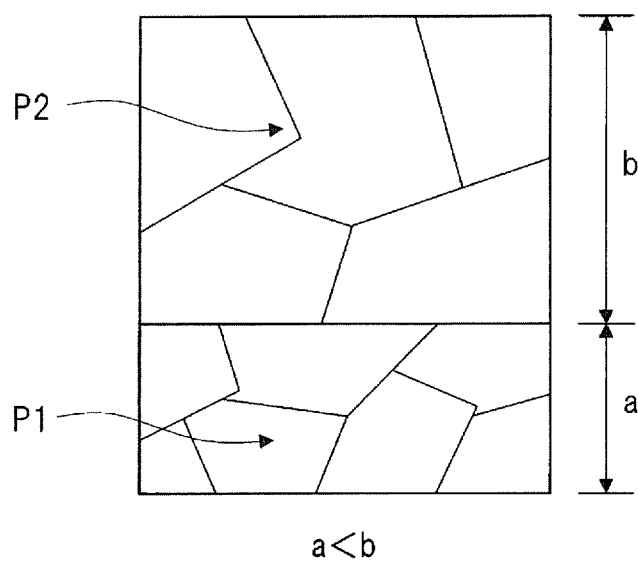

FIG. 18A is a cross-sectional view schematically showing the size of grains in the polysilicon film P1 and the polysilicon film P2 stacked in First Embodiment and FIG. 18B is a cross-sectional view schematically showing the size of grains in the polysilicon film P1 and the polysilicon film P2 stacked in the present embodiment. In FIG. 18A, the thickness a of the polysilicon film P1 is equal to the thickness b of the polysilicon film P2, while in FIG. 18B, the thickness of the polysilicon film a of the polysilicon film P1 is smaller than the thickness b of the polysilicon film P2.

As shown in FIG. 18B, by thinning the polysilicon film P1 which is the lower layer of the polysilicon films (refer to FIG. 17) configuring the control gate electrode CG and the gate electrodes G2 to G4, the size of grains in the polysilicon film P1 can be decreased. This means that the size of grains in the polysilicon film P1 which is the lower layer can be made smaller than that in the polysilicon film P2 which is the upper layer.

This facilitates diffusion of an impurity in the bottom portion of each of the control gate electrode CG and the gate electrodes G2 to G4. Compared with First Embodiment, this embodiment therefore makes it easy to prevent depletion of the control gate electrode CG and the gate electrodes G2 to G4 and prevent variation in the threshold voltage. As a result, the semiconductor device obtained in the present embodiment can have improved reliability compared with First Embodiment.

In the example given in the present embodiment, the thickness of the polysilicon film P2 of each of the control gate electrode CG and the gate electrodes G2 to G4 is made small, but it is also possible to provide a difference in the thickness between the upper polysilicon film and the lower polysilicon film, depending on the gate electrode. This means that only in the control gate electrode CG, the thickness of the polysilicon film P1 may be made smaller than that of the polysilicon film P2; or only in the gate electrodes G2 to G4, the thickness of the polysilicon film P1 may be made smaller than that of the polysilicon film P2.

The invention made by the present inventors has been described specifically based on some embodiments. The present invention is not limited to or by these embodiments, but it is needless to say that it can be changed in various ways without departing from the gist of the invention.

For example, in First Embodiment and Second Embodiment, MOSFETs were formed on a semiconductor substrate, but a semiconductor element may be a MIS (metal insulator semiconductor) type FET.

Further, in First Embodiment and Second Embodiment, mainly a manufacturing step of an n channel type MOSFET was described as an example in the description of the manufacturing steps of a semiconductor device. The semiconductor substrate also has thereon a p channel type MOSFET having a similar structure. Even using a gate electrode having the above-mentioned two layer structure for the p channel type MOSFET can also produce an advantage similar to that obtained in First and Second Embodiments.

In First Embodiment and Second Embodiment, mainly gate electrodes each made of two layers of polysilicon films P1 and P2 were described as an example. The number of layers is not limited to two but it may be, for example, three or more. When the number of the layers is three or more, in Second Embodiment, the thickness of a polysilicon film formed as a lower layer is preferably made smaller than the thickness of the polysilicon film formed as an upper layer. In the case of, for example, three layers, the film thickness is desirably thinner in the order of the lower layer, middle layer and upper layer.

In addition, some of the details described in Embodiments will next be described.

(1) A method of manufacturing a semiconductor device having a nonvolatile memory over a semiconductor substrate, including the following steps of:

(a) forming a first insulating film over the semiconductor substrate;

(b) forming a first polysilicon film over the first insulating film;

(c) forming a second polysilicon film over the first polysilicon film;

(d) introducing an impurity into the first polysilicon film and the second polysilicon film;

(e) patterning the first polysilicon film and the second polysilicon film to form a selective gate electrode of the nonvolatile memory;

(f) forming a second insulating film having a charge storage film over the semiconductor substrate and the sidewall of the selective gate electrode; and (g) forming a memory gate electrode over the second insulating film so as to be in contact with the sidewall of the selective gate electrode via the second insulating film, wherein the thickness of the first polysilicon film is smaller than the thickness of the second polysilicon film, and wherein in the step (f), the impurity in the first polysilicon film and the second polysilicon film is activated.

(2) The method of manufacturing a semiconductor device as described above in (1), wherein the memory gate electrode is in sidewall form.

(3) The method of manufacturing a semiconductor device as described above in (2), wherein the memory gate electrode includes a third polysilicon film, wherein the memory gate electrode has thereover a silicide layer, and wherein the second polysilicon film has thereover a third insulating film and does not have the silicide layer.

(4) A semiconductor device having a nonvolatile memory over a semiconductor substrate, the nonvolatile memory having:

a first insulating film formed over the semiconductor substrate;

a selective gate electrode formed over the first insulating film;

a second insulating film formed over the semiconductor substrate and over the sidewall of the selective gate electrode and having a charge storage film; and a memory gate electrode formed over the second insulating film and adjacent to the sidewall of the selective gate electrode via the second insulating film, wherein the selective gate electrode has a first polysilicon film formed over the first insulating film and a second polysilicon film formed over the first polysilicon film, and wherein the thickness of the first polysilicon film is smaller than that of the second polysilicon film.

What is claimed is:
1. A semiconductor device, comprising:
a semiconductor substrate having, over the main surface thereof, a first region, a second region, and a third region;
a nonvolatile memory formed in the first region;

a first field effect transistor of a first conductivity type formed in the second region; and a second field effect transistor of the first conductivity type formed in the third region and having a drive voltage lower than that of the first field effect transistor, wherein the nonvolatile memory comprises:

a selective gate electrode having a first polysilicon film and a second polysilicon film stacked successively over the semiconductor substrate via a first insulating film; and a memory gate electrode contiguous to the sidewall of the selective gate electrode and the main surface of the semiconductor substrate via a third insulating film formed by successively stacking a second insulating film and a charge storage film, wherein the first field effect transistor has a first gate electrode including a third polysilicon film and a fourth polysilicon film stacked successively over the semiconductor substrate, wherein the second field effect transistor has a second gate electrode including a fifth polysilicon film and a sixth polysilicon film stacked successively over the semiconductor substrate, wherein the first polysilicon film, the third polysilicon film, and the fifth polysilicon film are films of the same layer, and wherein the second polysilicon film, the fourth polysilicon film, and the sixth polysilicon film are films of the same layer.

2. The semiconductor device according to claim 1,
wherein the second gate electrode configures a portion of a third field effect transistor of a second conductivity type which is a conductivity type different from the first conductivity type.

3. The semiconductor device according to claim 2,
wherein the second field effect transistor and the third field effect transistor configure a SRAM,
wherein the second field effect transistor is a driver transistor, and
wherein the third field effect transistor is a load transistor.

4. The semiconductor device according to claim 2,
wherein the second field effect transistor and the third field effect transistor configure a CMOS inverter.

5. The semiconductor device according to claim 4, further comprising:
a fourth field effect transistor in a fourth region over the semiconductor substrate,
wherein a third gate electrode configuring the fourth field effect transistor includes at least a seventh polysilicon film of the same layer as that of the first polysilicon film and an eighth polysilicon film of the same layer as the second polysilicon film formed over the seventh polysilicon film, and
wherein the third gate electrode does not configure a portion of a field effect transistor having a conductivity type different from that of the fourth field effect transistor.

6. The semiconductor device according to claim 1,
wherein the charge storage film is a silicon nitride film.

7. The semiconductor device according to claim 1, wherein the thickness of the first polysilicon film, the thickness of the third polysilicon film, and the thickness of the fifth polysilicon film are smaller than the thickness of the second polysilicon film, the thickness of the fourth polysilicon film, and the thickness of the sixth polysilicon film, respectively.

* * * * *